United States Patent
Caron

(10) Patent No.: US 11,563,418 B2
(45) Date of Patent: Jan. 24, 2023

(54) METHODS OF MANUFACTURING ACOUSTIC WAVE RESONATORS WITH ISOLATION

(71) Applicant: Skyworks Solutions, Inc., Irvine, CA (US)

(72) Inventor: Joshua James Caron, Madison, NC (US)

(73) Assignee: Skyworks Solutions, Inc., Irvine, CA (US)

( * ) Notice: Subject to any disclaimer, the term of this patent is extended or adjusted under 35 U.S.C. 154(b) by 281 days.

(21) Appl. No.: 16/818,142

(22) Filed: Mar. 13, 2020

(65) Prior Publication Data

US 2020/0313646 A1    Oct. 1, 2020

Related U.S. Application Data

(60) Provisional application No. 62/823,437, filed on Mar. 25, 2019, provisional application No. 62/823,415, filed on Mar. 25, 2019.

(51) Int. Cl.
| | |
|---|---|
| *H03H 9/02* | (2006.01) |
| *H03H 9/25* | (2006.01) |
| *H03H 9/72* | (2006.01) |
| *H03H 3/08* | (2006.01) |
| *H03H 9/64* | (2006.01) |

(52) U.S. Cl.
CPC .......... *H03H 9/02905* (2013.01); *H03H 3/08* (2013.01); *H03H 9/02559* (2013.01); *H03H 9/02614* (2013.01); *H03H 9/25* (2013.01); *H03H 9/6483* (2013.01); *H03H 9/725* (2013.01)

(58) Field of Classification Search
CPC .......... H03H 9/02905; H03H 9/02559; H03H 9/02614; H03H 9/25; H03H 9/6483; H03H 9/725; H03H 3/08
See application file for complete search history.

(56) References Cited

U.S. PATENT DOCUMENTS

| | | | |
|---|---|---|---|
| 7,296,329 B1 | 11/2007 | Barber et al. | |
| 7,583,161 B2 | 9/2009 | Tanaka | |
| 7,609,129 B2 | 10/2009 | Yokota et al. | |
| 7,893,792 B2 | 2/2011 | Hwang et al. | |
| 10,879,870 B2 | 12/2020 | Kishimoto et al. | |
| 2002/0158707 A1* | 10/2002 | Noguchi | H03H 9/0576 333/133 |
| 2004/0173816 A1* | 9/2004 | Saxler | H03H 3/08 257/195 |
| 2016/0049920 A1 | 2/2016 | Kishino | |
| 2020/0313645 A1 | 10/2020 | Caron | |

OTHER PUBLICATIONS

U.S. Appl. No. 16/818,118 Published as 2020/0313645 A1, filed Mar. 13, 2020, Acoustic Wave Filters With Isolation.

* cited by examiner

*Primary Examiner* — Samuel S Outten
(74) *Attorney, Agent, or Firm* — Knobbe, Martens, Olson & Bear, LLP

(57) ABSTRACT

Embodiments of this disclosure relate to methods of manufacturing acoustic wave components that include acoustic wave resonators that share a substrate. Laser light can be applied to alter a region of the substrate that is located between two of the acoustic wave resonators. Altering the region with laser light can reduce coupling between the two acoustic resonators through the substrate. The substrate can be monolithic after laser the light is applied.

23 Claims, 20 Drawing Sheets

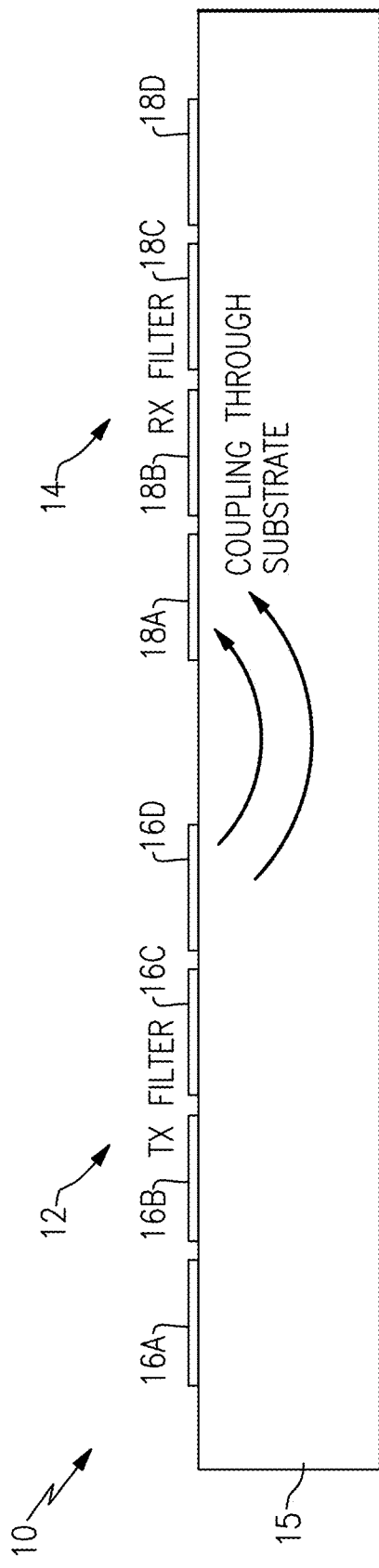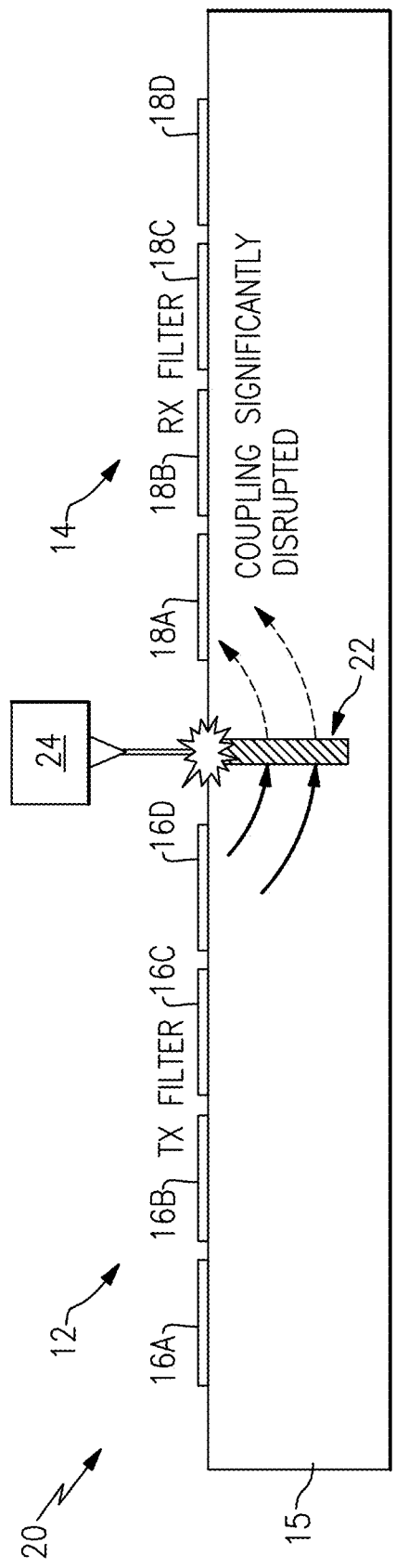

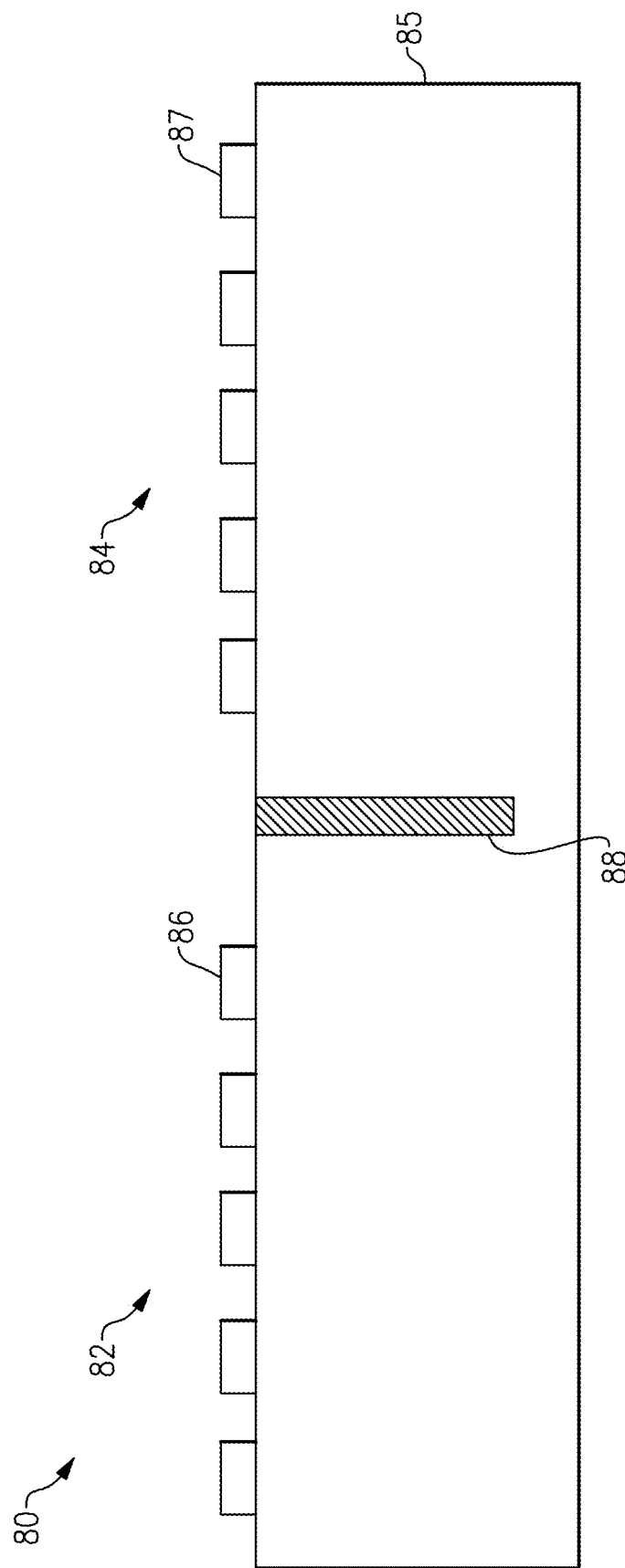

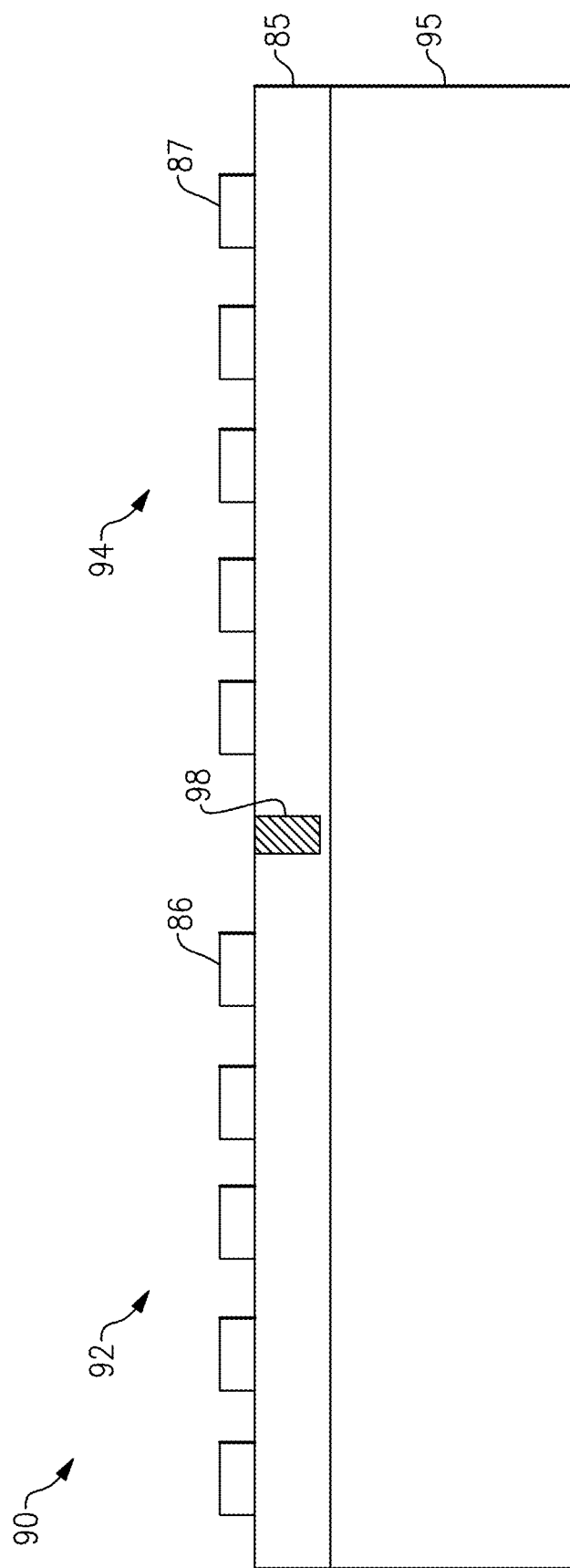

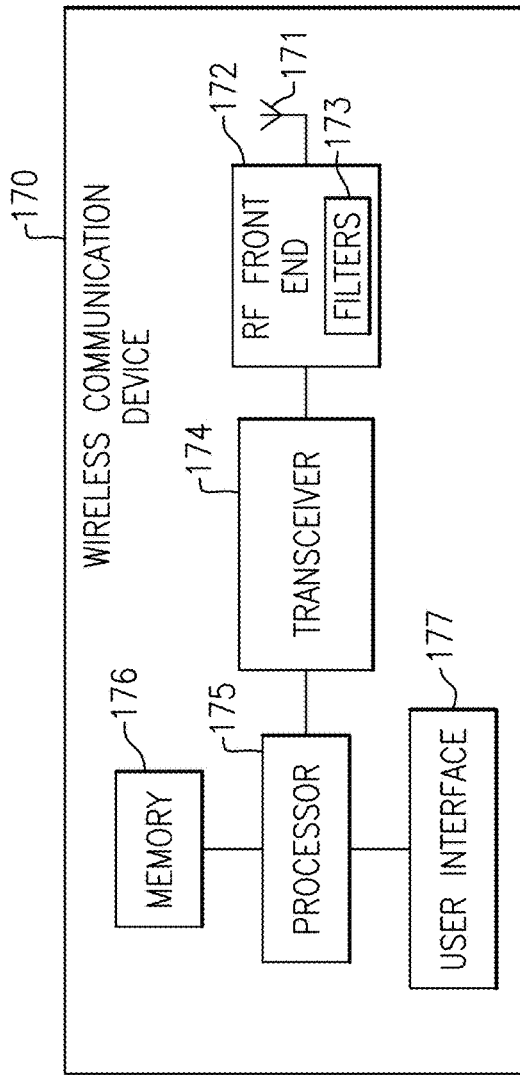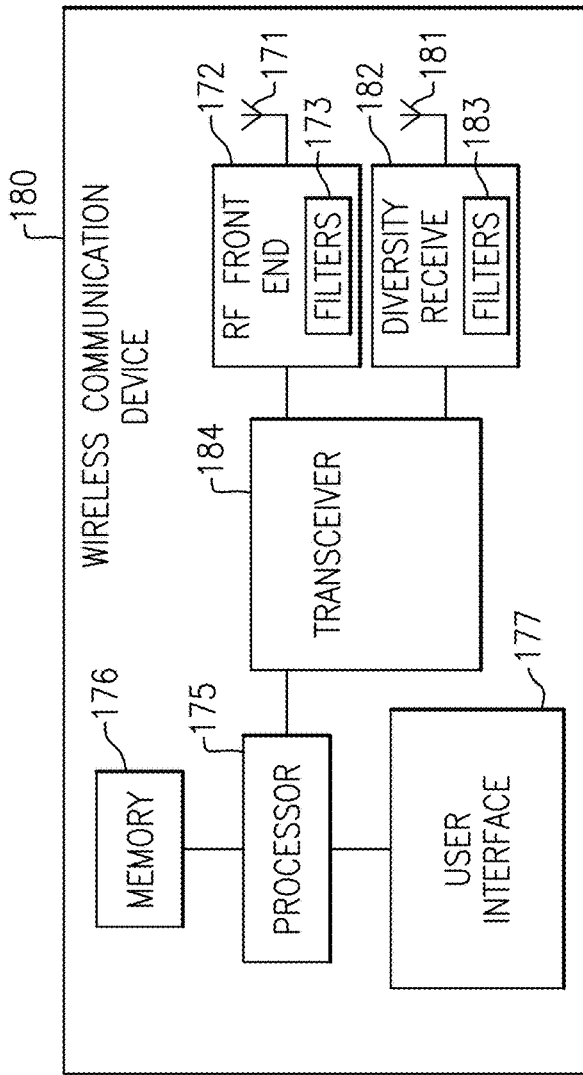

METHODS OF MANUFACTURING ACOUSTIC WAVE RESONATORS WITH ISOLATION

CROSS REFERENCE TO PRIORITY APPLICATIONS

This application claims the benefit of priority of U.S. Provisional Patent Application No. 62/823,415, filed Mar. 25, 2019 and titled "ACOUSTIC WAVE FILTERS WITH ISOLATION," and also claims the benefit of priority of U.S. Provisional Patent Application No. 62/823,437, filed Mar. 25, 2019 and titled "METHODS OF MANUFACTURING ACOUSTIC WAVE RESONATORS WITH ISOLATION," the disclosures of each which are hereby incorporated by reference in their entireties herein.

BACKGROUND

Technical Field

Embodiments of this disclosure relate to reducing coupling between radio frequency components, such as acoustic wave resonators.

Description of Related Technology

Acoustic wave filters can be implemented in radio frequency electronic systems. For instance, filters in a radio frequency front end of a mobile phone can include acoustic wave filters. An acoustic wave filter can be a band pass filter. A plurality of acoustic wave filters can be arranged as a multiplexer. For example, two acoustic wave filters can be arranged as a duplexer.

An acoustic wave filter can include a plurality of acoustic wave resonators arranged to filter a radio frequency signal. Example acoustic wave filters include surface acoustic wave (SAW) filters and bulk acoustic wave (BAW) filters. A SAW resonator can include an interdigital transductor electrode on a piezoelectric substrate. The SAW resonator can generate a surface acoustic wave on a surface of the piezoelectric layer on which the interdigital transductor electrode is disposed. There can be capacitive coupling between SAW resonators on the same substrate. Capacitive feedthrough can undesirably impact performance of a SAW filter and/or a duplexer that includes a SAW filter.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

One aspect of this disclosure is an acoustic wave filter assembly with improved isolation between filters. The acoustic wave filter assembly includes a first acoustic wave filter configured to filter a first radio frequency signal, and a second acoustic wave filter configured to filter a second radio frequency signal. The first acoustic wave filter and the second acoustic wave filter share a substrate. An isolation region of the substrate is arranged to cause capacitive coupling between the first acoustic wave filter and the second acoustic wave filter to be reduced.

The isolation region can extend through only part of a thickness of the substrate. The isolation region can have a lower dielectric constant than other regions of the substrate. The substrate can have a crystalline structure that is disrupted in the isolation region. The substrate can have a single crystal structure that is disrupted in the isolation region. The isolation region can be formed by applying laser light to the substrate.

The first acoustic wave filter can be a surface acoustic wave filter. The first filter and the second filter can be coupled together at a common node and included in a multiplexer. The first filter and the second filter can be included in a duplexer.

The substrate can be a lithium niobate substrate. The substrate can be a lithium tantalate substrate.

Another aspect of this disclosure is an acoustic wave filter assembly with improved isolation between filters. The acoustic wave filter assembly includes a multiplexer and an isolation region of a piezoelectric substrate. The multiplexer includes a transmit filter and a receive filter coupled to each other at a common node. The transmit filter includes first acoustic wave resonators, the receive filter includes second acoustic wave resonators, and the transmit filter and the receive filter share the piezoelectric substrate. The isolation region is arranged to cause capacitive coupling between the transmit filter and the receive filter to be reduced.

The multiplexer can be a duplexer. The piezoelectric substrate can have a crystalline structure that is disrupted in the isolation region Another aspect of this disclosure is a front end module that includes any acoustic wave filter assembly disclosed herein, other circuitry, and a package enclosing the acoustic wave filter assembly and the other circuitry.

The other circuitry can include a multi throw radio frequency switch. The other circuitry can include a power amplifier. The other circuitry can include a low noise amplifier.

Another aspect of this disclosure is a wireless communication device that includes an antenna and any acoustic wave filter assembly disclosed herein. A first acoustic wave filter pf the acoustic wave filter assembly is arranged to filter a radio frequency signal associated with the antenna.

Another aspect of this disclosure is an acoustic wave resonator assembly with improved isolation. The acoustic wave resonator assembly includes a first acoustic wave resonator; a second acoustic wave resonator, in which the first acoustic wave resonator and the second acoustic wave resonator share a substrate; and an isolation region of the substrate arranged to cause capacitive coupling between the first acoustic wave resonator and the second acoustic wave resonator to be reduced.

The isolation region can extend through only part of a thickness of the substrate. The substrate can have a crystalline structure that is disrupted in the isolation region. The isolation region can be formed by applying laser light to the substrate.

The first acoustic wave resonator can be a surface acoustic wave resonator.

The substrate can be a lithium niobate substrate. The substrate can be a lithium tantalate substrate.

The first acoustic wave resonator can be included in a different acoustic wave filter than the second acoustic wave resonator. The first acoustic wave resonator and the second acoustic wave resonator can be included in a single acoustic wave filter.

Another aspect of this disclosure is a radio frequency component with reduced coupling between radio frequency elements. The radio frequency component includes a first radio frequency element on a monolithic substrate; a second radio frequency element on the monolithic substrate, the monolithic substrate having a dielectric constant of at least 10 in regions under the first radio frequency element and the second radio frequency element; and an isolation region of the monolithic substrate arranged to reduce capacitive coupling between the first radio frequency element and the second radio frequency element. The isolation region has a dielectric constant that is less than the dielectric constant of the regions under the first radio frequency element and the second radio frequency element.

The isolation region can extend through some but not all of a thickness of the monolithic substrate. The monolithic substrate can have a crystalline structure that is disrupted in the isolation region.

The dielectric constant of the monolithic substrate can be at least 30 in the regions under the first radio frequency component and the second radio frequency component.

Outside the isolation region a remainder of the monolithic substrate can have a dielectric constant of at least 10. Outside the isolation region a remainder of the monolithic substrate can have a dielectric constant of at least 30.

Another aspect of this disclosure is a method of manufacturing an acoustic wave component that includes acoustic wave resonators. The method includes providing a first acoustic wave resonator and a second acoustic resonator, the first acoustic wave resonator and the second acoustic wave resonator sharing a substrate; and applying, with a laser, laser light to alter a region of the substrate located between the first acoustic wave resonator and the second acoustic wave resonator, the substrate being monolithic after the applying.

The method can further include aligning the laser to a feature on the substrate before the applying.

The method can further include performing wafer level packaging after the applying.

The first acoustic wave resonator can be a first surface acoustic wave resonator, and the second acoustic wave resonator can be a second acoustic wave resonator. The substrate can be a lithium niobate substrate. The substrate can be a lithium tantalate substrate.

The region can extend only part way through a thickness of the substrate. The region can have a lower dielectric constant than other regions of the substrate. The substrate can have a crystalline structure that is disrupted in the region.

The first acoustic wave resonator can be included in a first filter, and the second acoustic wave resonator can be included in the second filter. The first filter and the second filter can be coupled to each other at a common node, and the first filter and the second filter can be included in a multiplexer. The multiplexer can be a duplexer, for example.

Another aspect of this disclosure is a method of manufacturing an acoustic wave component. The method includes forming a first acoustic wave resonator and a second acoustic resonator that share a substrate; aligning a laser to a feature on the substrate; applying, with the laser, laser light to alter a region of the substrate located between the first acoustic wave resonator and the second acoustic wave resonator, the substrate being monolithic after the applying; and after the applying, packaging the first acoustic wave resonator and the second acoustic wave resonator to form a packaged acoustic wave component.

The first acoustic wave resonator can be a first surface acoustic wave resonator, and the second acoustic wave resonator can be a second surface acoustic wave resonator. The substrate can be a lithium based piezoelectric substrate.

The region can extend through some but not all of a thickness of the substrate.

The first acoustic wave resonator can be included in a first filter, the second acoustic wave resonator can be included in the a second filter, and the region can be located between the first filter and the second filter. The first filter and the second filter can be included in a multiplexer. The first filter and the second filter can be included in a duplexer.

Another aspect of this disclosure is a method of manufacturing a surface acoustic wave component. The method includes providing a piezoelectric substrate with a first interdigital transducer electrode of a first surface acoustic wave resonator and a second interdigital transducer electrode of a second surface acoustic resonator thereon; aligning a laser to a feature on the piezoelectric substrate; and applying, with the laser, laser light to alter a region of the piezoelectric substrate located between the first interdigital transducer electrode and the second interdigital transducer electrode to thereby reduce a dielectric constant of the region, the piezoelectric substrate being monolithic after the applying.

The feature can be at least part of the first interdigital transducer electrode.

The providing can include providing the piezoelectric substrate attached to a support substrate.

The first surface acoustic wave resonator can be included in a transmit filter of a multiplexer, the second surface acoustic wave resonator can be included in a receive filter of the multiplexer, and the region can be located between the transmit filter and the receive filter.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

The present disclosure relates to U.S. patent application Ser. No. 16/818,118, titled "ACOUSTIC WAVE FILTERS WITH ISOLATION," filed on even date herewith, the entire disclosure of which is hereby incorporated by reference herein.

BRIEF DESCRIPTION OF THE DRAWINGS

Embodiments of this disclosure will now be described, by way of non-limiting example, with reference to the accompanying drawings.

FIG. 1 is a cross sectional diagram of an acoustic wave filter assembly with coupling through a substrate.

FIG. 2 is a cross sectional diagram of an acoustic wave filter assembly with an isolation region reducing coupling through a substrate according to an embodiment.

FIG. 8A is a cross sectional view of a surface acoustic wave resonator assembly according to an embodiment.

FIG. 9 is a cross sectional view of a surface acoustic wave resonator assembly according to another embodiment.

FIG. 17A is a schematic block diagram of a wireless communication device that includes filters in accordance with one or more embodiments.

FIG. 17B is a schematic block diagram of another wireless communication device that includes filters in accordance with one or more embodiments.

DETAILED DESCRIPTION OF CERTAIN EMBODIMENTS

Figure 3:
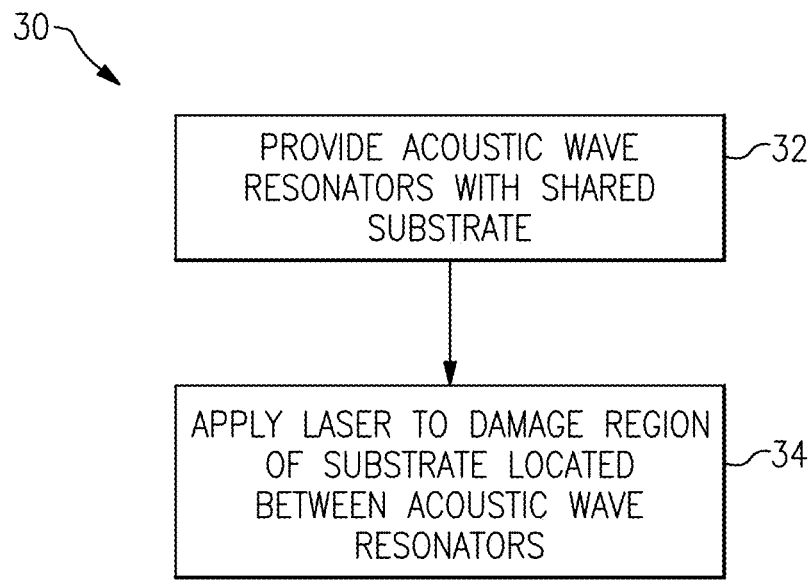
FIG. 3 is a flow diagram of an example process of manufacturing an acoustic wave component that involves applying laser light to a region of a substrate between acoustic wave resonators according to an embodiment.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Surface acoustic wave (SAW) duplexers can include a transmit (Tx) filter and a receive (Rx) filter coupled together at a common node, such as an antenna node. Due to relatively wide bandwidth specifications, SAW duplexers commonly include a strongly coupling piezoelectric substrate material, such as lithium niobate ($LiNbO_3$) or lithium tantalate ($LiTaO_3$). In addition to piezoelectricity, the strong polarity of the crystalline structures of lithium niobate and lithium tantalate tends to impart a relatively large dielectric constant. For example, in certain directions along the crystalline axes, the relative dielectric constant of lithium niobate and the relative dielectric constant of lithium tantalate can exceed 50. This strong dielectric nature can result in relatively high levels of capacitive feedthrough among conductive structures on the crystal surface of such a piezoelectric substrate. In the case of a SAW duplexer, the capacitive feedthrough can limit the achievable isolation between transmit and receive ports.

One way to address this problem is to make the die as large as possible. This can limit capacitive feedthrough by the distance of separation of the transmit port and the receive port. However, increasing die area typically increases cost. Increasing die size also goes against the industry trend of increasingly smaller filters.

Another way to address capacitive feedthrough in a SAW duplexer is to fabricate the transmit filter of a duplexer on one die and to fabricate a receive filter of the duplexer on another die. However, this can consume precious real estate on a wafer in order to accommodate the extra dicing lines and keep-out regions for dicing and wafer-level packaging. Implementing transmit and receive filters of a duplexer on separate dies can increase the size and cost of the duplexer due to the extra area and placement costs of a solution with two dies versus a single die. In addition, it can be more difficult to meet stringent duplexer specifications with filters implemented on different dies.

One other way to address capacitive feedthrough in a SAW duplexer is to apply a shielding technique. For example, a grounded metal trace can be formed to separate the transmit filter of a duplexer from the receive filter of the duplexer. With such shielding, however, the functionality of the shield can be limited due to the inability to penetrate into the depth of the piezoelectric crystal where a majority and/or a significant amount of the electric field may be confined.

Aspects of this disclosure relate to reducing capacitive feedthrough between a transmit filter and a receive filter by lowering a dielectric constant of a piezoelectric crystalline substrate in a region located between the transmit filter and the receive filter. Lowering the dielectric constant can be achieved by altering the crystalline structure of a piezoelectric substrate along a region separating the transmit filter and the receive filter. The crystalline structure can be altered to a depth that extends significantly into the piezoelectric substrate.

Altering the crystalline structure can be achieved by applying laser light to a region of the piezoelectric substrate to cause a dielectric constant of the region to be reduced. The laser light can cause the region of the piezoelectric substrate to become amorphous, polycrystalline, or undergo a phase change to a state with a lower dielectric constant. The laser light can heat the piezoelectric substrate to cause a phase change the structure and properties of the region of the piezoelectric substrate. After applying laser light, the region can no longer be piezoelectric while other regions of the piezoelectric substrate remain piezoelectric. The laser light can heat the piezoelectric substrate to cause a change in dielectric constant. The laser light can be applied, for example, by a carbon dioxide ($CO_2$) laser with a relatively small spot size. By applying laser light along a line between a transmit filter and a receive filter, the crystal structure of the piezoelectric substrate can be damaged and/or altered to the point of significantly reducing the dielectric constant without physically removing a significant amount of material. The resulting region of low-dielectric material in the piezoelectric substrate separating the two filters can result in improved isolation between the two filters.

Embodiments disclosed herein can reduce capacitive coupling between filters (e.g., a transmit filter of a duplexer and a receive filter of the duplexer) such that the filters can be on the same die. Including the filters on the same die can lead to smaller size, reduced cost, and easier manufacturing. Altering the piezoelectric layer can have little or no impact on the fabrication or packaging specifications. In some instances, a region of the piezoelectric substrate can be altered with the same laser that is used to dice wafers. In the case of a duplexer, having a transmit filter and a receive filter on the same die can be advantageous for meeting duplexer specifications. For example, filters on the same die can track certain frequency variations, such as variation in center frequency, such that the absolute difference in frequency variation is not impacted by relative die related frequency variation. With variations in filters on the same die tracking frequency variations, a transmit filter and a receive filter on the same die can more easily meet duplexer specifications. On the other hand, transmit and receive filters of a duplexer on separate respective dies can experience different relative shifts in center frequency. The different relative shifts in frequency can dramatically impact duplexer isolation in certain applications.

Duplexers with transmit and receive filters on the same die can also be significantly more area efficient that duplexers with transmit and receive filters on separate dies. There can be a difference in size between filters (e.g., a transmit filter can occupy more physical area than a receive filter) that can make optimizing area utilization more difficult.

Embodiments disclosed herein relate to an isolation region of a substrate between acoustic wave resonators of the same filter. The isolation region can reduce capacitive coupling between acoustic wave resonators of the same filter. This can increase performance of the filter. Moreover, any suitable principles and advantages disclosed herein can be implemented to reduce coupling between any suitable acoustic wave elements through a shared substrate. For example, an isolation region in a substrate can be implemented between an acoustic wave delay line and another acoustic wave element.

FIG. 1 is a cross sectional diagram of an acoustic wave filter assembly 10 with electrical coupling through a substrate. The illustrated acoustic wave filter assembly 10 includes a transmit filter 12 and a receive filter 14 that share a substrate 15. The transmit filter 12 includes acoustic wave resonators 16A, 16B, 16C, and 16D. The receive filter 14 includes acoustic wave resonators 18A, 18B, 18C, and 18D. One or more of the illustrated acoustic wave resonators can correspond to a group of acoustic wave resonators in certain applications. As shown in FIG. 1, there can be electrical coupling from the transmit filter 12 to the receive filter 14 through the substrate 15. This can undesirably impact the performance of the receive filter 14.

FIG. 2 is a cross sectional diagram of an acoustic wave filter assembly 20 with an isolation region reducing electrical coupling through a substrate according to an embodiment. The illustrated acoustic wave filter assembly 20 includes a transmit filter 12 and a receive filter 14 that share a substrate 15. The acoustic wave filter assembly 20 also includes an isolation region 22 in the substrate 15 between the transmit filter 12 and the receive filter 14. The transmit filter 12 includes acoustic wave resonators 16A, 16B, 16C, and 16D. The receive filter 14 includes acoustic wave resonators 18A, 18B, 18C, and 18D. One or more of the illustrated acoustic wave resonator can correspond to a group of acoustic wave resonators in certain applications. The acoustic wave resonators of the transmit filter 12 and the receive filter 14 can be surface acoustic wave resonators that share a common lithium based piezoelectric substrate, such as a lithium niobate substrate or a lithium tantalate substrate. The substrate 15 can be lithium niobate, lithium tantalate, zinc oxide, aluminum nitride, or any other suitable piezoelectric material. The substrate 15 can be a multi-layer piezoelectric substrate in certain instances. The transmit filter 12 and the receive filter 14 can be included in a multiplexer such as a duplexer, for example. Multiplexers can have fixed multiplexing, switched multiplexing, or a combination of fixed and switched multiplexing.

The isolation region 22 can significantly reduce and/or disrupt coupling between the transmit filter 12 and the receive filter 14. Capacitive coupling between the transmit filter 12 and the receive filter 14 can be reduced by the isolation region 22 relative to a similar acoustic wave filter assembly without the isolation region 22, such as in the acoustic wave filter assembly 10 of FIG. 1. The isolation region 22 can be referred to as a low dielectric region. The isolation region 22 can be referred to as an altered region in certain instances. The isolation region 22 can be referred to as a damaged region in some instances.

A laser 24 can apply laser light to the substrate 15 to form the isolation region 22. For clarity, the laser 24 is not part of the acoustic wave filter assembly 20 and instead a tool that can be used in manufacturing the acoustic wave filter assembly 20. The laser light can cause a local temperature in a region of the substrate 15 to increase to the point where a crystal structure of the substrate 15 undergoes a phase transition to form the isolation region 22. The substrate 15 can be a piezoelectric substrate having a crystalline structure that is disrupted in the isolation region 22. The laser 24 can be a carbon dioxide laser. The laser 24 can be the same laser used to dice and singulate acoustic wave components. Forming the isolation region 22 can involve applying lower power laser light than dicing and singulating acoustic wave components. The substrate 15 is monolithic after the laser 24 applies laser light to form the isolation region 22.

As illustrated in FIG. 2, the isolation region 22 extends through some but not all of a thickness of the substrate 15. This can help preserve mechanical integrity of the surface acoustic wave assembly 20. The isolation region 22 can extend into the substrate 15 to a distance that is sufficient to significantly reduce coupling between the transit filter 12 and the receive filter 14. The isolation region 22 can extend into the substrate 15 to a distance that is on the order of a distance separating the transmit filter 12 from the receive filter 14. The isolation region 22 can have any suitable width, such as a width of about 10 microns along the surface of the substrate 15 between the acoustic wave resonators 16D and 18A.

The isolation region 22 has a lower dielectric constant than other regions of the substrate 15. For example, the isolation region 22 has a lower dielectric constant than regions of the substrate 15 below elements of the transmit filter 12 and elements of the receive filter 14 that are above the substrate 15. The isolation region 22 can have a lower dielectric constant than the remainder of the substrate 15.

The isolation region 22 can be any suitable shape that provides isolation between the transmit filter 12 and the receive filter 12. For example, in certain instances, an isolation region can be curved instead of having a boundary than generally extends along a line.

FIG. 3 is a flow diagram of an example process 30 of manufacturing an acoustic wave component that involves applying laser light to a region of a substrate between acoustic wave resonators according to an embodiment. The process 30 is an example process of making an isolation region in a substrate between acoustic wave resonators, in which the isolation region reduces capacitive feedthrough. The process 30 can be implemented in manufacturing any suitable acoustic wave filter assembly and/or any suitable acoustic wave resonator assembly disclosed herein. The process 30 includes providing acoustic wave resonators on a common substrate at block 32 and applying laser light to alter a region of the substrate between the acoustic wave resonators at block 34. The laser light can be applied to alter the substrate to reduce capacitive coupling through the substrate such that the substrate is still monolithic after the laser light is applied at block 34.

At block 32, a first acoustic wave resonator and a second acoustic resonator sharing a substrate are provided. The first acoustic wave resonator and the second acoustic wave resonator can be surface acoustic wave resonators. The common substrate can be a lithium based piezoelectric substrate, such as a lithium niobate substrate or a lithium tantalate substrate. There can be relatively strong coupling through such substrates. The first acoustic wave resonator can be included in a first filter, and the second acoustic wave resonator can be included in the second filter. The first filter and the second filter can be on the same substrate. The first filter and the second filter can be coupled to each other at a common node, and the first filter and the second filter can be included in a multiplexer. The first filter and the second filter can be arranged as a duplexer. In certain instances, the first filter can be a transmit filter and the second filter can be a receive filter.

At block 34, laser light is applied to the substrate using a laser to alter a region of the substrate located between the first acoustic wave resonator and the second acoustic wave resonator. The substrate is monolithic after applying the laser light at block 34. Applying laser light can damage a crystal structure of the substrate. The region can no longer be piezoelectric after the laser light is applied at block 34. The substrate can be referred to as a piezoelectric substrate when the region is not piezoelectric. The laser light can be applied with a carbon dioxide laser, for example. In some instances, the same laser used for dicing components can be used to apply the laser light at block 34. In such instances, the laser can apply lower powered laser light for altering the substrate than for dicing components. The laser light can be applied to a surface on the front side of the substrate on which acoustic wave resonators are positioned. There can be an opening in one or more layers over the substrate (e.g., a silicon dioxide layer and/or a silicon nitride layer) for the laser light to be applied. This can reduce an impact of the one or more layers on the laser light. In some other applications, the laser light can be applied to a backside of the substrate, in which the back side is opposite to the front side on which the acoustic wave resonators are positioned.

The altered region can extend only part way through a thickness of the substrate. The altered region can have a lower dielectric constant than other regions of the substrate. Accordingly, the altered region can be referred to as a low dielectric region. The altered region can be referred to as an isolation region. In certain applications, the substrate has a crystalline structure that is disrupted in the altered region. With the altered region, there is reduced capacitive coupling between the first acoustic wave resonator and the second acoustic wave resonator.

Figure 4A:
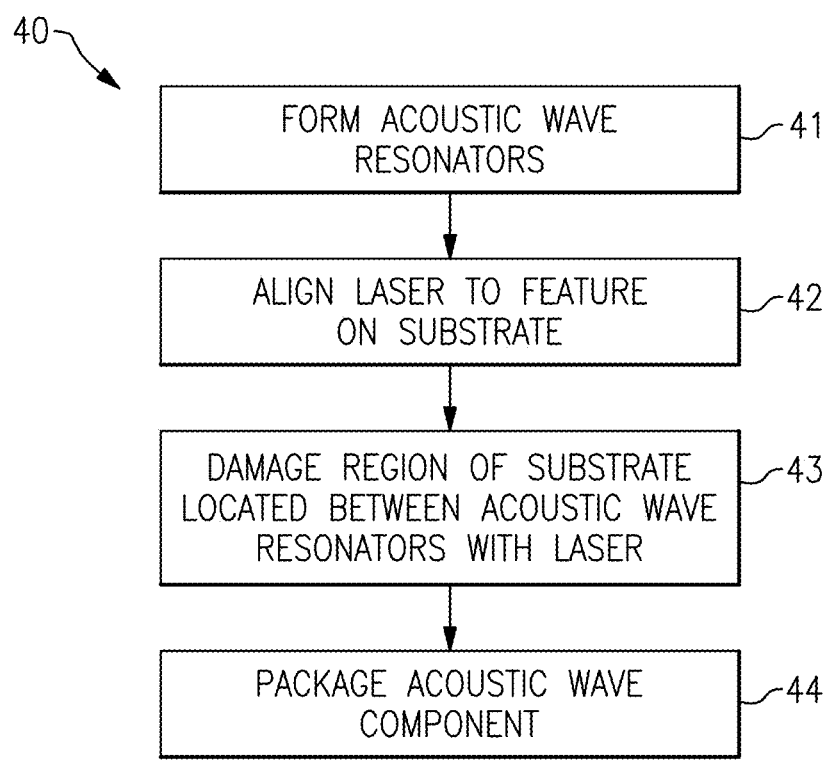
FIG. 4A is a flow diagram of an example process of manufacturing an acoustic wave component that involves applying laser light to a region of a substrate between acoustic wave resonators according to another embodiment.

FIG. 4A is a flow diagram of an example process 40 of manufacturing an acoustic wave component that involves applying laser light to alter a region of a substrate between acoustic wave resonators according to another embodiment. The process 40 is an example process of manufacturing an acoustic wave component. The process 40 can be implemented in manufacturing any suitable acoustic wave filter assembly and/or any suitable acoustic wave resonator assembly disclosed herein. Any suitable features of the process 40 can be implemented together with any suitable features of the process 30.

At block 41, a first acoustic wave resonator and a second acoustic resonator are formed. The first acoustic wave resonator and the second acoustic wave resonator share a substrate. The first surface acoustic wave resonator and the second acoustic wave resonator can be surface acoustic wave resonators. The first acoustic wave resonator can be included in a first filter, and the second acoustic wave resonator can be included in the second filter. The first filter and the second filter can be included in a multiplexer, such as a duplexer. The substrate can be a piezoelectric substrate, such as a lithium niobate substrate or a lithium tantalate substrate.

A laser is aligned to a feature on the substrate at block 42. The feature can be any suitable feature of the substrate. The feature can be at least part of an interdigital transducer electrode of the first acoustic wave resonator in certain applications. Laser alignment can involve optical alignment. Aligning the laser can ensure precision in forming an altered region in the substrate.

At block 43, laser light is applied to alter a region of the substrate located between the first acoustic wave resonator and the second acoustic wave resonator. The substrate is monolithic after applying the laser light at block 43. Applying laser light at block 43 can be implemented in accordance with any suitable principles and advantages disclosed in association with applying laser light at block 34 in the process 30. The altered region can have any suitable combination of features disclosed in connection with the altered regions and/or isolation regions disclosed herein.

The first acoustic wave resonator and the second acoustic wave resonator are packaged to form a packaged acoustic wave component at block 44. The first acoustic wave resonator and the second acoustic wave resonator can be packaged after the laser light is applied at block 43. The packaged acoustic wave component includes the first acoustic wave resonator and the second acoustic resonator that are enclosed within a common package and share a monolithic substrate.

Figure 4B:
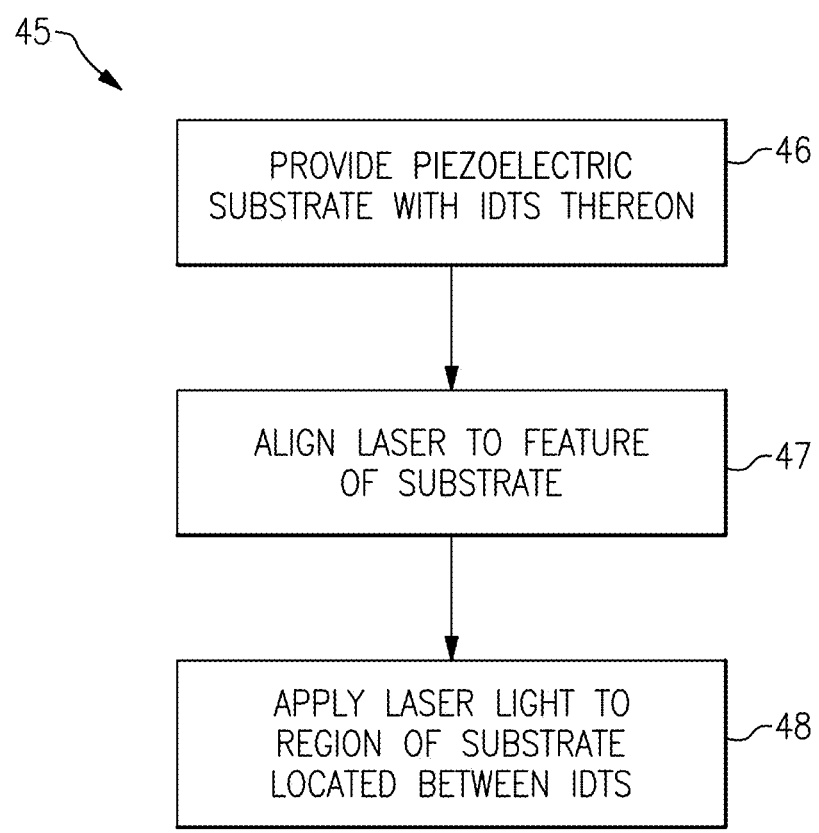
FIG. 4B is a flow diagram of an example process of manufacturing an acoustic wave component that involves applying laser light to a region of a substrate between interdigital transducer electrodes of acoustic wave resonators according to an embodiment.

FIG. 4B is a flow diagram of an example process 45 of manufacturing an acoustic wave component that involves applying laser light to alter a region of a substrate between interdigital transducer electrodes of acoustic wave resonators according to an embodiment. The process 45 is an example process of manufacturing an acoustic wave component. The process 45 can be implemented in manufacturing any suitable acoustic wave filter assembly and/or any suitable acoustic wave resonator assembly disclosed herein. Any suitable features of the process 45 can be implemented together with any suitable features of the process 30 and/or the process 40.

At block 46, a piezoelectric substrate is provided with a first interdigital transducer electrode of a first surface acoustic wave resonator and a second interdigital transducer electrode of a second surface acoustic resonator thereon. The piezoelectric layer can be a lithium based substrate, such as a lithium niobate substrate or a lithium tantalate substrate. In some applications, the piezoelectric substrate is attached to a support substrate at block 46.

The first surface acoustic wave resonator can be included in a first filter, the second surface acoustic wave resonator can be included in the second filter, and the region can be located between the first filter and the second filter. The first filter can be a transmit filter of a multiplexer, and the second filter can be a receive filter of the multiplexer. The first filter and the second filter can be arranged as a duplexer.

A laser is aligned to a feature on the piezoelectric substrate at block 47. The feature can be at least part of the first interdigital transducer electrode.

At block 48, laser light is applied to alter a region of the piezoelectric substrate located between the first interdigital transducer electrode and the second interdigital transducer electrode to thereby reduce a dielectric constant of the region. The piezoelectric substrate is monolithic after laser light is applied at block 48. The region can extend only part way through a thickness of the piezoelectric substrate. The piezoelectric substrate can have a crystalline structure that is disrupted in the region. Wafer level package can be performed after laser light is applied at block 48.

Although methods of forming an isolation region by applying laser light are disclosed herein, other suitable methods can be implemented to form an isolation region.

As an example, an isolation region can be formed by ion bombardment and/or ion implantation in a substrate. Ion bombardment and/or implantation techniques may involve use of a hard mask to prevent damage to areas of a substrate where crystalline integrity is to be maintained.

As another example, a method of localized heating that does not involve laser light can be employed to form an isolation region. Such a method can include heating a localized area of a substrate to the point where the substrate becomes amorphous, polycrystalline, or undergoes a phase change to a state with a lower dielectric constant.

As one more example, an isolation region can be formed by mechanical removal and replacement of a portion of the substrate. A mechanical dicing saw can mechanically cut into the substrate. This can form a trench in the substrate. The trench can be filled with epoxy and/or any other suitable material with a relatively low dielectric constant. Such a material being included in the trench formed by the mechanical cut can increase the mechanical integrity of the substrate. At the same time, the dielectric constant of the isolation region formed by this process can be reduced relative to other regions of the substrate.

Any isolation region disclosed herein can be formed by any applying laser light and/or by any other suitable method disclosed herein. Such isolation regions can reduce capacitive coupling between acoustic wave resonators through a substrate. Forming an isolation region by applying laser light can result in a different physical structure than forming an isolation region using a different method.

Figure 5A:
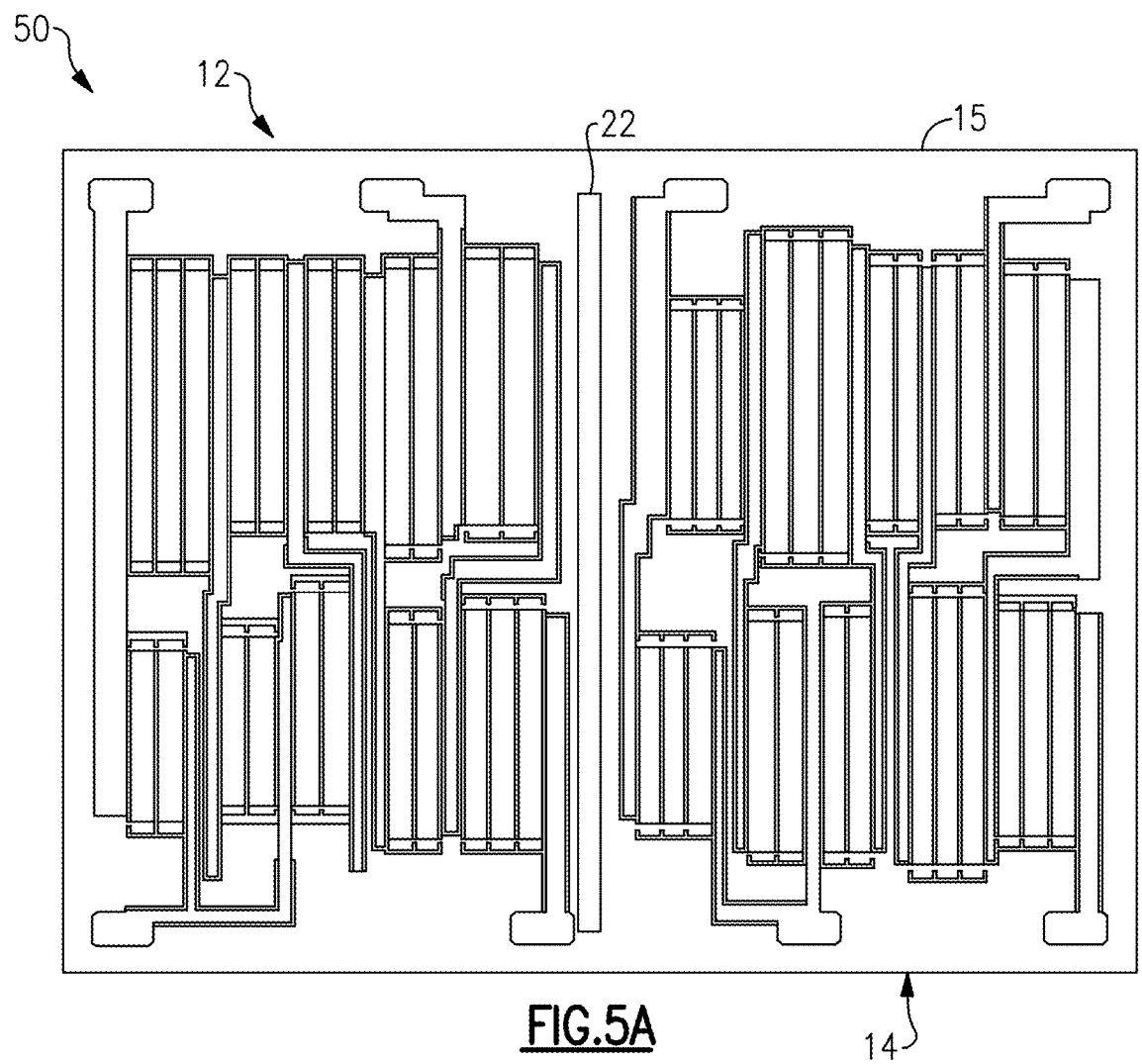
FIG. 5A is a top view of an acoustic wave filter assembly according to an embodiment.

FIG. 5A is a top view of an acoustic wave filter assembly 50 according to an embodiment. As illustrated, the acoustic wave filter assembly 50 includes a transmit filter 12, a receive filter 14, a substrate 15 shared by the transmit filter 12 and the receive filter 14, and an isolation region 22. Although the transmit filter 12 and the receive filter 14 are illustrated as being similar sizes, the transmit filter 12 can be larger than the receive filter 14 in certain applications. The transmit filter 12 includes a plurality of acoustic wave resonators arranged to filter a radio frequency signal. The acoustic wave resonators of the transmit filter 12 can be surface acoustic wave resonators. The receive filter 14 includes a plurality of acoustic wave resonators arranged to filter a radio frequency signal. The acoustic wave resonators of the receive filter 14 can be surface acoustic wave resonators. The isolation region 22 is a region of the substrate 15 that extends between the transmit filter 12 and the receive filter 14. The isolation region 22 can reduce coupling between the transmit filter 12 and the receive filter 14. The isolation region 22 can be formed by applying laser light to the substrate 15. The illustrated substrate 15 is a piezoelectric substrate with an isolation region 22.

Figure 5B:
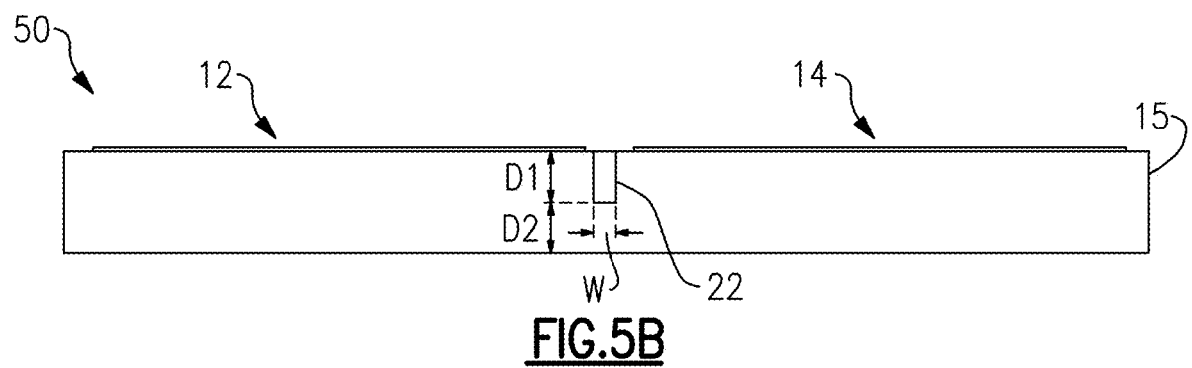
FIG. 5B is a side view of the acoustic wave filter assembly of FIG. 5A.

FIG. 5B is a side view of the acoustic wave filter assembly 50 of FIG. 5A. As shown in FIG. 5B, the isolation region 22 extends to a distance $D_1$ from a front surface of the substrate 15 into the substrate 15. The distance $D_1$ can be sufficient to reduce coupling between the transmit filter 12 and the receive filter 14. The distance $D_1$ can be on the order of the distance between the transmit filter 12 and the receive filter 14. The distance $D_1$ can be in a range from about 10 micrometers (um) to 150 um, for example. The isolation region 22 is also separated from a back surface of the substrate 15 by a distance $D_2$. Separating the isolation region 22 from the back surface of the substrate 15 can reduce the chance of the substrate 15 breaking apart into separate pieces and/or experiencing other mechanical integrity issues. The distance $D_2$ can be in a range from about 20 um to 250 um, for example. The isolation region 22 also has a width W. The width W can depend on a width of a beam of laser light applied to the substrate 15 to form the isolation region 22 in certain instances. The width W can be sufficiently wide to provide significant isolation between the transmit filter 12 and the receive filter 14. The width W can be in a range from about 1 um to 100 um, for example. In some such instances, the width W can be in a range from about 1 um to 50 um. In certain applications, the width W can be in a range from about 1 um to 20 um.

Figure 5C:
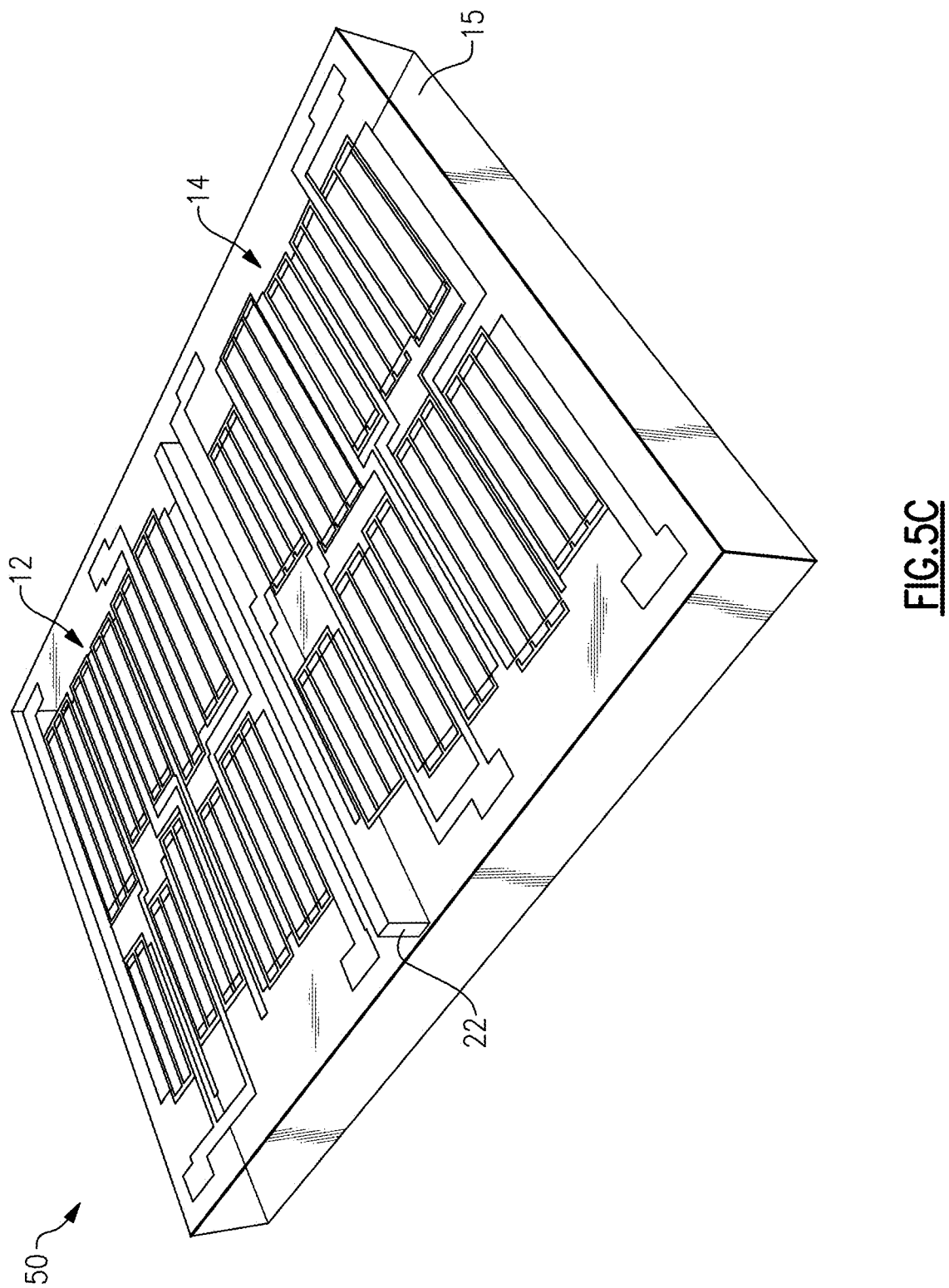
FIG. 5C is a three-dimensional view of the acoustic wave filter assembly of FIG. 5A.

FIG. 5C is a three-dimensional view of the acoustic wave filter assembly 50 of FIG. 5A. As shown in FIG. 5C, an acoustic wave component can include the transmit filter 12, the receive filter 14, and an isolation region 22 between the transmit filter 12 and the receive filter 14 in the substrate 15. The transmit filter 12 and the receive filter 14 can be included in a duplexer in certain instances.

Figure 6A:
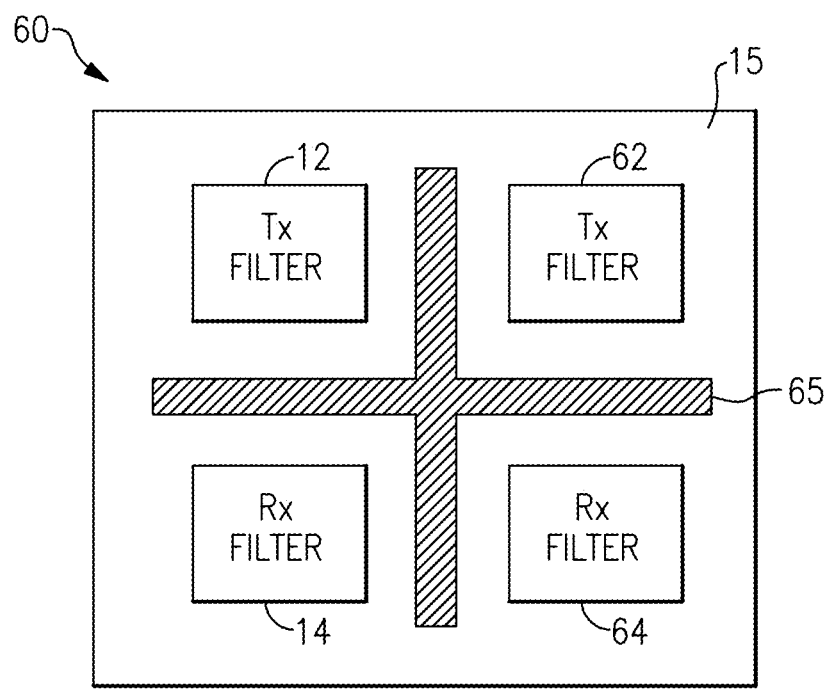
FIG. 6A is a diagram of an acoustic wave filter assembly according to an embodiment.
Figure 6B:
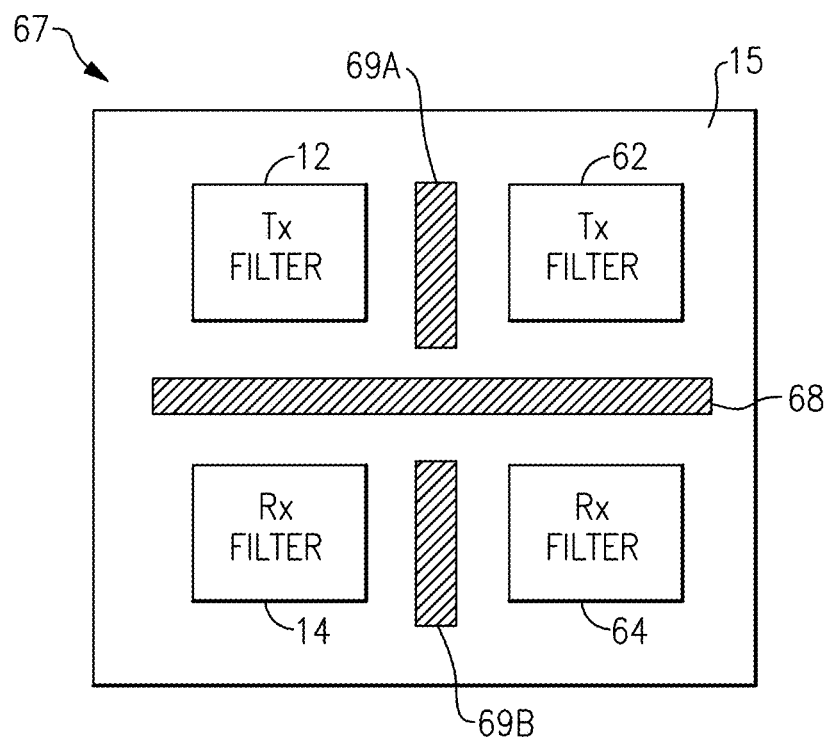
FIG. 6B is a diagram of an acoustic wave filter assembly according to another embodiment.

Although FIGS. 5A to 5C show an acoustic wave filter assembly that includes two filters, three or more filters can be included in an acoustic wave component with isolation between filters. FIGS. 6A and 6B show example acoustic wave filter assemblies that include four acoustic wave filters. The principles and advantages disclosed in association with FIGS. 6A and 6B can be applied to acoustic wave filter assemblies and/or acoustic wave components that include any suitable number of acoustic wave filters on a common substrate.

FIG. 6A is a diagram of an acoustic wave filter assembly 60 according to an embodiment. The illustrated acoustic wave filter assembly 60 includes a first transmit filter 12, a second transmit filter 62, a first receive filter 14, a second receive filter 64, and an isolation region 65 in the substrate 15. In the acoustic wave filter assembly 60, the isolation region 65 has a cross pattern. The isolation region 65 can reduce coupling between the first transmit filter 12 and the first receive filter 14. The isolation region 65 can reduce coupling between the second transmit filter 62 and the second receive filter 64. The isolation region 65 can reduce coupling between the first transmit filter 12 and the second transmit filter 62. The isolation region 65 can reduce coupling between the first receive filter 14 and the second receive filter 64. The isolation region 65 can be implemented in accordance with any suitable principles and advantages disclosed herein.

FIG. 6B is a diagram of an acoustic wave filter assembly 67 according to an embodiment. The illustrated acoustic wave filter assembly 67 includes a first transmit filter 12, a second transmit filter 62, a first receive filter 14, a second receive filter 64, and isolation regions 68, 69A, and 69B in the substrate 15. The acoustic wave filter assembly 67 is like the acoustic wave filter assembly 60 of FIG. 6A except that the isolation regions 68, 69A, and 69B have a different shape than the isolation region 65 of FIG. 6A. The isolation regions 69A and 69B are spaced apart from the isolation region 68 in the acoustic wave filter assembly 67. The acoustic wave filter assemblies 60 and 67 provide examples of isolation regions. Any other suitable shape of isolation region(s) can be implemented in an acoustic wave filter assembly to provide a desired level of isolation between acoustic wave resonators and/or acoustic wave filters.

Referring to FIG. 6B, the isolation region 68 can reduce coupling between (a) the first transmit filter 12 and the first receive filter 14 and (b) the second transmit filter 62 and the second receive filter 64. The isolation region 69A can reduce coupling between the first transmit filter 12 and the second transmit filter 62. The isolation region 69B can reduce coupling between the first receive filter 14 and the second receive filter 64. The isolation regions 68, 69A, and 69B can each be implemented in accordance with any suitable principles and advantages disclosed herein.

Figure 7:
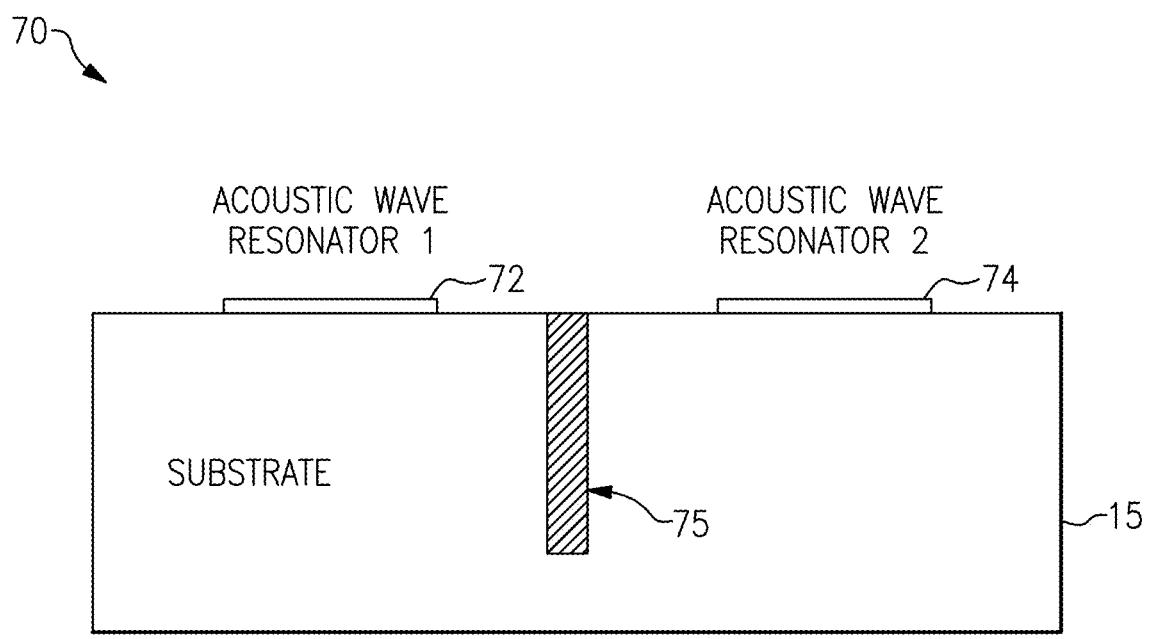
FIG. 7 is a cross sectional view of an acoustic wave resonator assembly according to an embodiment.

FIG. 7 is a cross sectional view of an acoustic wave resonator assembly 70 according to an embodiment. The illustrated acoustic wave resonator assembly 70 includes a first acoustic wave resonator 72, a second acoustic wave resonator 74, and an isolation region 75 in a substrate 15. FIG. 7 illustrates that the principles and advantages of the isolation regions and/or altered regions disclosed herein can be applied to reduce coupling between any suitable acoustic wave resonators. Similarly, any suitable principles and advantages of the isolation regions and/or altered regions disclosed herein can be applied to reduce coupling between any suitable acoustic wave elements. The first acoustic wave resonator 72 and the second acoustic wave resonator 74 can be included in different filters. The different filters can be included in a multiplexer, such as a duplexer. In some instances, the first acoustic wave resonator 72 and the second acoustic wave resonator 74 can be included in the same filter.

The first acoustic wave resonator 72 and the second acoustic wave resonator 74 can be any suitable acoustic wave resonators with a shared substrate 15. The first acoustic wave resonator 72 and the second acoustic wave resonator 74 can be the same type of acoustic wave resonator. For example, first acoustic wave resonator 72 and the second acoustic wave resonator 74 can both be surface acoustic wave resonators. In certain instances, the first acoustic wave resonator 72 can be a different type of acoustic wave resonator than the second acoustic wave resonator 74. The first acoustic wave resonator 72 and the second acoustic wave resonator 74 can include any of the acoustic wave resonator combinations in the Table 1.

TABLE 1

Acoustic Wave Resonator Combinations

| First Acoustic Wave Resonator 72 | First Acoustic Wave Resonator 74 |
|---|---|
| Surface acoustic wave resonator | Surface acoustic wave resonator |
| Surface acoustic wave resonator | Boundary wave acoustic wave resonator |
| Surface acoustic wave resonator | Bulk wave acoustic wave resonator |
| Surface acoustic wave resonator | Lamb wave acoustic wave resonator |
| Temperature compensated surface acoustic wave resonator | Non-temperature compensated surface acoustic wave resonator |
| Boundary wave acoustic wave resonator | Boundary wave acoustic wave resonator |
| Boundary wave acoustic wave resonator | Bulk wave acoustic wave resonator |
| Boundary wave acoustic wave resonator | Lamb wave acoustic wave resonator |
| Lamb wave acoustic wave resonator | Lamb wave acoustic wave resonator |
| Lamb wave acoustic wave resonator | Bulk wave acoustic wave resonator |
| Bulk wave acoustic wave resonator | Bulk wave acoustic wave resonator |

Figure 8B:
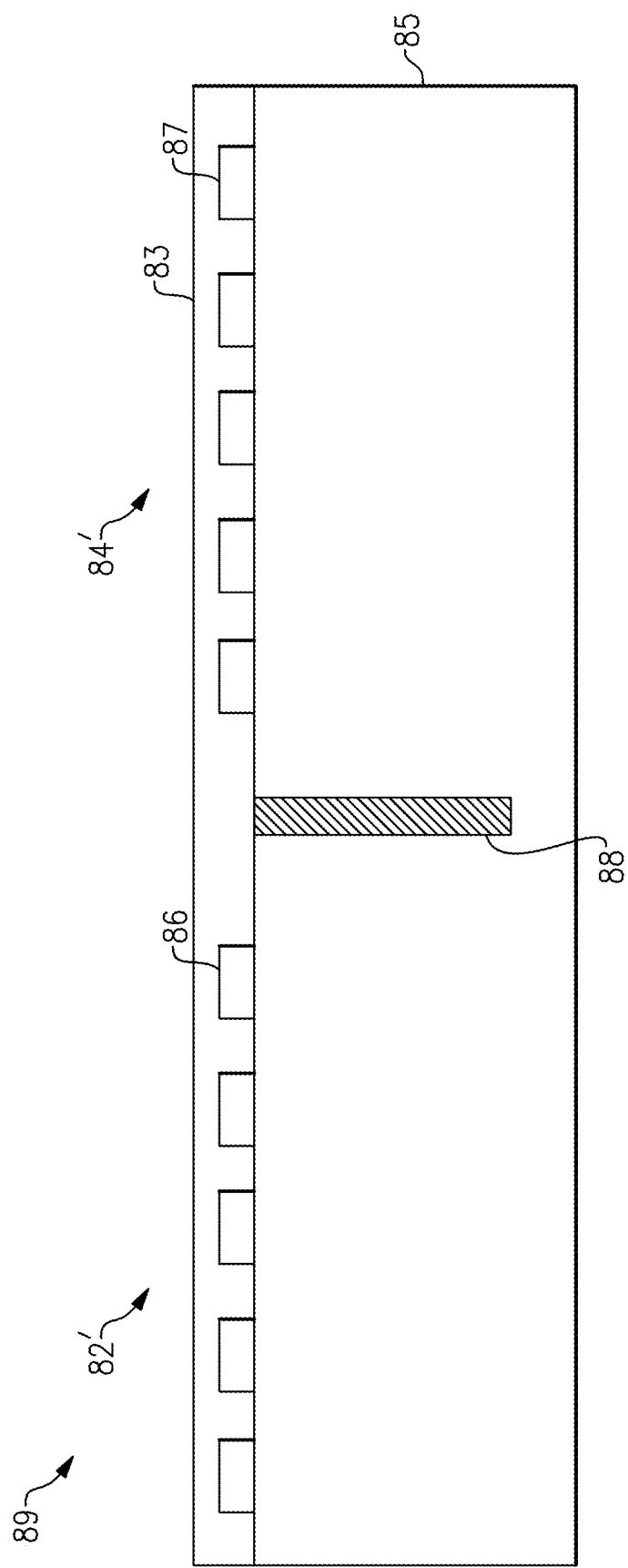
FIG. 8B is a cross sectional view of a surface acoustic wave resonator assembly according to another embodiment.

FIG. 8A is a cross sectional view of a surface acoustic wave resonator assembly 80 according to an embodiment. The illustrated surface acoustic wave resonator assembly 80 includes a first surface acoustic wave resonator 82 and a second surface acoustic wave resonator 84 that share a substrate 85. The first surface acoustic wave resonator 82 includes a first interdigital transducer electrode 86 on and in physical contact with the substrate 85. The second surface acoustic wave resonator 84 includes a second interdigital transducer electrode 87 on and in physical contact with the substrate 85. The substrate 85 can be a lithium niobate substrate or a lithium tantalate substrate. The interdigital transducer electrode 86 and 87 can include a single metal layer or a plurality of metal layers. In certain applications, a temperature compensation layer, such as a silicon dioxide layer, can be included over the interdigital transducer electrodes 86 and/or 87, for example, as shown in FIG. 8B.

The surface acoustic wave resonators 82 and 84 can be included in different filters. The surface acoustic wave resonators 82 and 84 can be included in a single filter. The isolation region 88 can reduce coupling between the first surface acoustic wave resonator 82 and the second surface acoustic wave resonator 84. The isolation region 88 can be implemented in accordance with any suitable principles and advantages of the isolation regions and/or altered regions disclosed herein.

FIG. 8B is a cross sectional view of a surface acoustic wave resonator assembly 89 according to an embodiment. The surface acoustic wave assembly 89 is like the surface acoustic wave assembly 80 of FIG. 8A, except that a temperature compensation layer 83 is included over the IDT electrodes 86 and 87. The surface acoustic wave resonators 82' and 84' of FIG. 8B can be referred to as temperature compensated surface acoustic wave resonators. The temperature compensation layer 83 can bring the temperature coefficient of frequency (TCF) of the surface acoustic wave resonators 82' and 84' closer to zero relative to the surface acoustic wave resonators 82 and 84 of FIG. 8A. The temperature compensation layer 83 can be a silicon dioxide (SiO$_2$) layer. The temperature compensation layer 83 can have a positive TCF to compensate for a negative TCF of the piezoelectric substrate 85. Accordingly, the temperature compensation layer 83 can be any other suitable material having a positive TCF, such as a tellurium dioxide (TeO$_2$) layer or a silicon oxyfluoride (SiOF). The temperature compensation layer 83 can include any suitable combination of SiO$_2$, TeO$_2$, and/or SiOF.

FIG. 9 is a cross sectional view of a surface acoustic wave resonator assembly 90 according to an embodiment. The illustrated surface acoustic wave resonator assembly 90 includes a first surface acoustic wave resonator 92 and a second surface acoustic wave resonator 94 that share a multi-layer piezoelectric substrate. FIG. 9 illustrates that any suitable principles and advantages disclosed herein can be applied to acoustic wave resonators with a multi-layer piezoelectric substrate.

The acoustic wave resonator assembly 90 is like the acoustic wave resonator assembly 80 of FIG. 8A except that the acoustic wave resonator assembly 90 includes a multi-layer piezoelectric substrate. The multi-layer piezoelectric substrate includes a piezoelectric substrate 85 and a support substrate 95. The first surface acoustic wave resonator 92 includes a first interdigital transducer electrode 86 on and in physical contact with the piezoelectric substrate 85. The second surface acoustic wave resonator 94 includes a second interdigital transducer electrode 87 on and in physical contact with the piezoelectric substrate 85. The piezoelectric substrate 85 can be a lithium niobate substrate or a lithium tantalate substrate. The support substrate 95 can be a silicon substrate, a quartz substrate, a sapphire substrate, a ceramic substrate, a polycrystalline spinel substrate, a glass substrate, or any other suitable carrier substrate. As an example, the acoustic wave resonator assembly 80 can include a piezoelectric substrate 85 that is lithium niobate and a support substrate 95 that is silicon. In certain applications, a temperature compensation layer, such as a silicon dioxide layer, can be included over the interdigital transducer electrodes 86 and/or 87.

In the acoustic wave resonator assembly 80, the piezoelectric layer 85 can have a thickness on the order of 10s of λ, in which λ is a wavelength of a surface acoustic wave generated by the first surface acoustic wave resonator 92. In certain applications, the piezoelectric layer 85 can have a thickness in a range from 3λ to 40λ, in which λ is a wavelength of a surface acoustic wave generated by the first surface acoustic wave resonator 92. The thickness of the piezoelectric layer 85 can be around 20 microns to 30 microns in certain instances.

There can be significant coupling between the first surface acoustic wave resonator 92 and the second surface acoustic wave resonator 94 through the substrate 85 without the isolation region 98. The isolation region 98 can reduce coupling between the surface acoustic wave resonators 92 and 94. The isolation region 98 can have a depth and width sufficient to provide a significant reduction in coupling between the surface acoustic wave resonators 92 and 94. The isolation region 98 can be implemented in accordance with any suitable principles and advantages of the isolation regions and/or altered regions disclosed herein.

Figure 10:
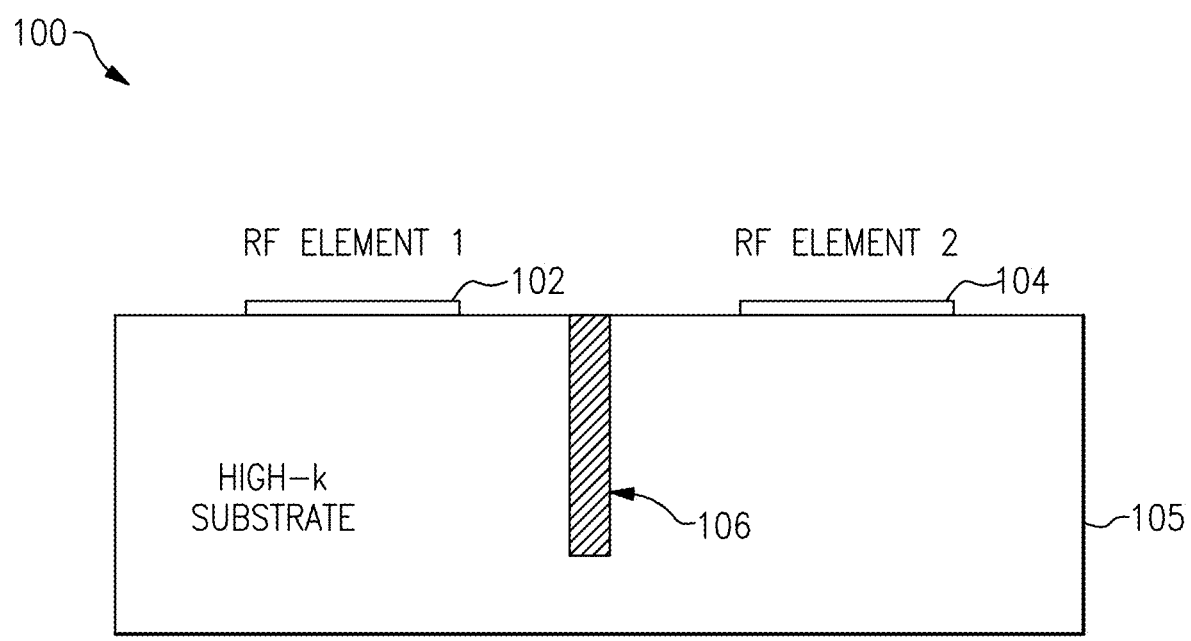
FIG. 10 is a cross sectional view of a radio frequency component with reduced coupling between radio frequency elements according to an embodiment.

FIG. 10 is a cross sectional view of a radio frequency component 100 with reduced coupling between radio frequency elements according to an embodiment. The illustrated radio frequency component 100 includes a first radio frequency element 102 on a monolithic substrate 105, a second radio frequency element 104 on the monolithic substrate 105, and an isolation region 106 of the monolithic substrate 105 that is arranged to reduce capacitive coupling between the first radio frequency element 102 and the second radio frequency element 104. Examples of radio frequency elements of the radio frequency component 100 include one or more filters, one or more capacitors, one or more inductors, one or more transformers, one or more radio frequency amplifiers, one or more radio frequency witches, one or more couplers, or any suitable combination thereof. The monolithic substrate 105 can have a relatively high dielectric constant outside of the isolation region 106. In some instances, the monolithic substrate 105 can be a single crystal piezoelectric substrate. The isolation region 106 has a dielectric constant that is less than the dielectric constant of the regions under the first radio frequency element 102 and the second radio frequency element 104.

The dielectric constant of the monolithic substrate 105 can be at least 10 in regions under the first radio frequency component 102 and the second radio frequency component 104. In some such instances, the dielectric constant of the monolithic substrate is at least 30 in the regions under the first radio frequency component 102 and the second radio frequency component 104, such as in a range from 30 to 100. Outside of the isolation region 106, the dielectric constant of the monolithic substrate 105 can be similar or substantially the same.

As illustrated, the isolation region 106 extends through some but not all of a thickness of the monolithic substrate 105. The monolithic substrate 105 can have crystalline structure, such as a single crystal structure, that is disrupted in the isolation region 106. The isolation region 106 can be formed by applying laser light to the monolithic substrate 105. The isolation region 106 can be implemented in accordance with any suitable principles and advantages of the isolation regions and/or altered regions disclosed herein.

Figure 11A:
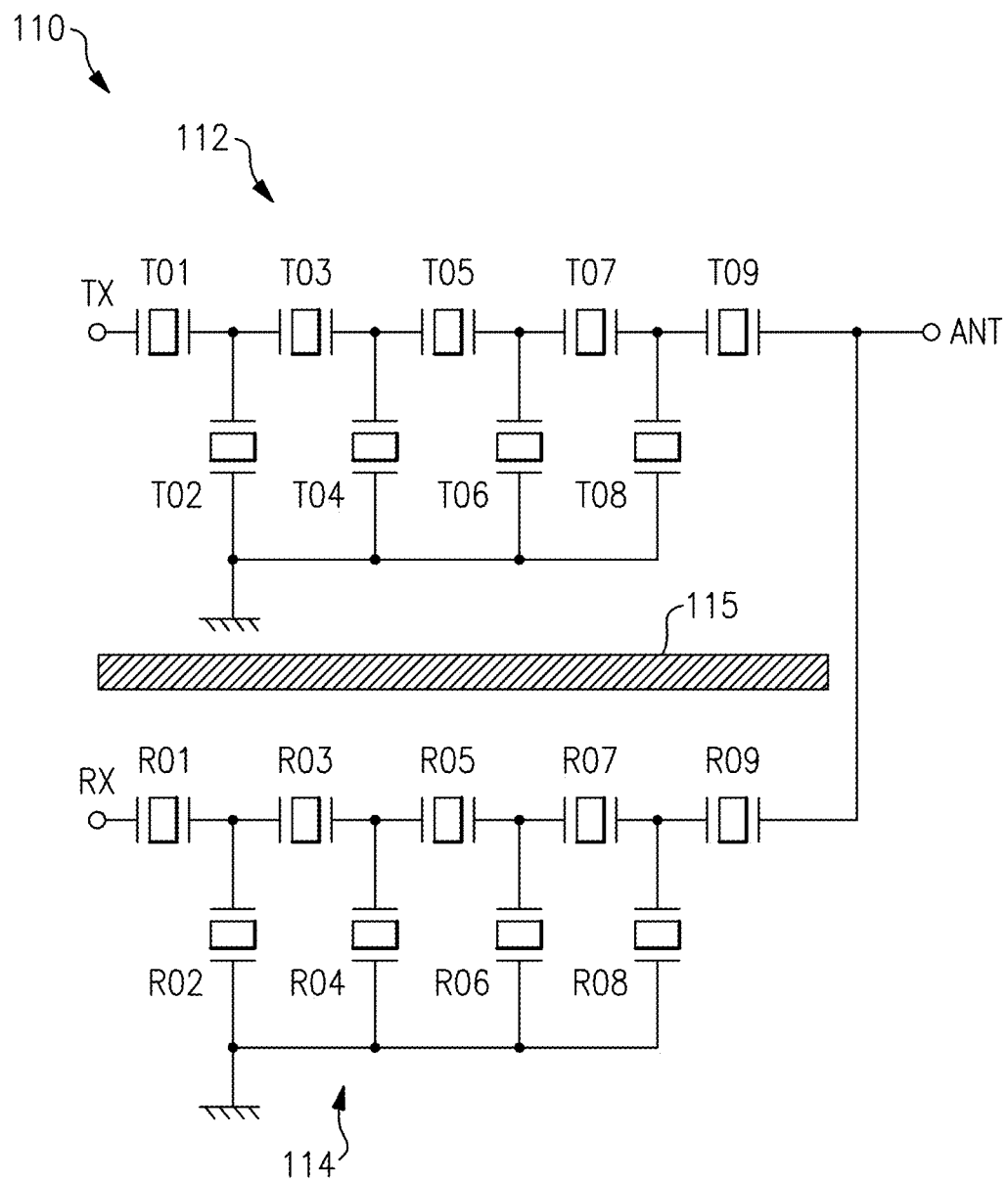
FIG. 11A is a schematic diagram of a duplexer with an isolation region between acoustic wave filters according to an embodiment.

FIG. 11A is a schematic diagram of a duplexer 110 with an isolation region between acoustic wave filters according to an embodiment. The duplexer 110 includes a transmit filter 112 and a receive filter 114 coupled to each other at an antenna node ANT. The transmit filter 112 and the receive filter 114 are both acoustic wave ladder filters in the duplexer 110. The transmit filter 112 and the receive filter 114 can filter radio frequency signals. The transmit filter 112 and the receive filter 114 filter can be implemented by acoustic wave resonators, such as surface acoustic wave resonators, implemented on a common die. An isolation region 115 can reduce coupling between the transmit filter 112 and the receive filter 114. Although FIG. 11A illustrates a duplexer, any suitable principles and advantages of the duplexers disclosed herein can be applied to other multiplexers. Moreover, any suitable principles and advantages of the isolation regions disclosed herein described with reference to a duplexer or a multiplexer can be implemented in a context of acoustic wave filters on the same substrate that are not included in the same multiplexer.

As illustrated, the transmit filter 112 includes acoustic wave resonators T01, T02, T03, T04, T05, T06, T07, T08, and T09 arranged to filter a radio frequency signal received at the transmit port TX. The acoustic wave resonators T01, T03, T05, T07, and T09 are series acoustic wave resonators. The acoustic wave resonators T02, T04, T06, and T08 are shunt acoustic wave resonators. Any of the illustrated acoustic wave resonators of the transmit filter 112 can be implemented by a group of acoustic wave resonators that includes series and/or shunt acoustic wave resonators. The transmit filter 112 can include any suitable number of series acoustic wave resonators and any suitable number of shunt acoustic wave resonators for a particular application.

As illustrated, the receive filter 114 includes acoustic wave resonators R01, R02, R03, R04, R05, R06, R07, R08, and R09 arranged to filter a radio frequency signal received at the antenna port ANT and provide a filtered radio frequency signal at a receive port RX. The acoustic wave resonators R01, R03, R05, R07, and R09 are series acoustic wave resonators. The acoustic wave resonators R02, R04, R06, and R08 are shunt acoustic wave resonators. Any of the illustrated acoustic wave resonators of the receive filter 114 can be implemented by a group of acoustic wave resonators that includes series and/or shunt acoustic wave resonators. The transmit filter 112 can include any suitable number of series acoustic wave resonators and any suitable number of shunt acoustic wave resonators for a particular application.

The isolation region 115 can improve isolation between the filters of the duplexer 110. The duplexer 110 can meet stringent duplexer isolation specifications with the transmit filter 112 and the receive filter 114 on a single die that has a relatively small area. The isolation region 115 can be implemented with any suitable principles and advantages disclosed herein. In some instances, a trace electrically connecting a filter of the duplexer 110 to the antenna node ANT can extend around an end the isolation region 115 in physical layout.

Figure 11B:
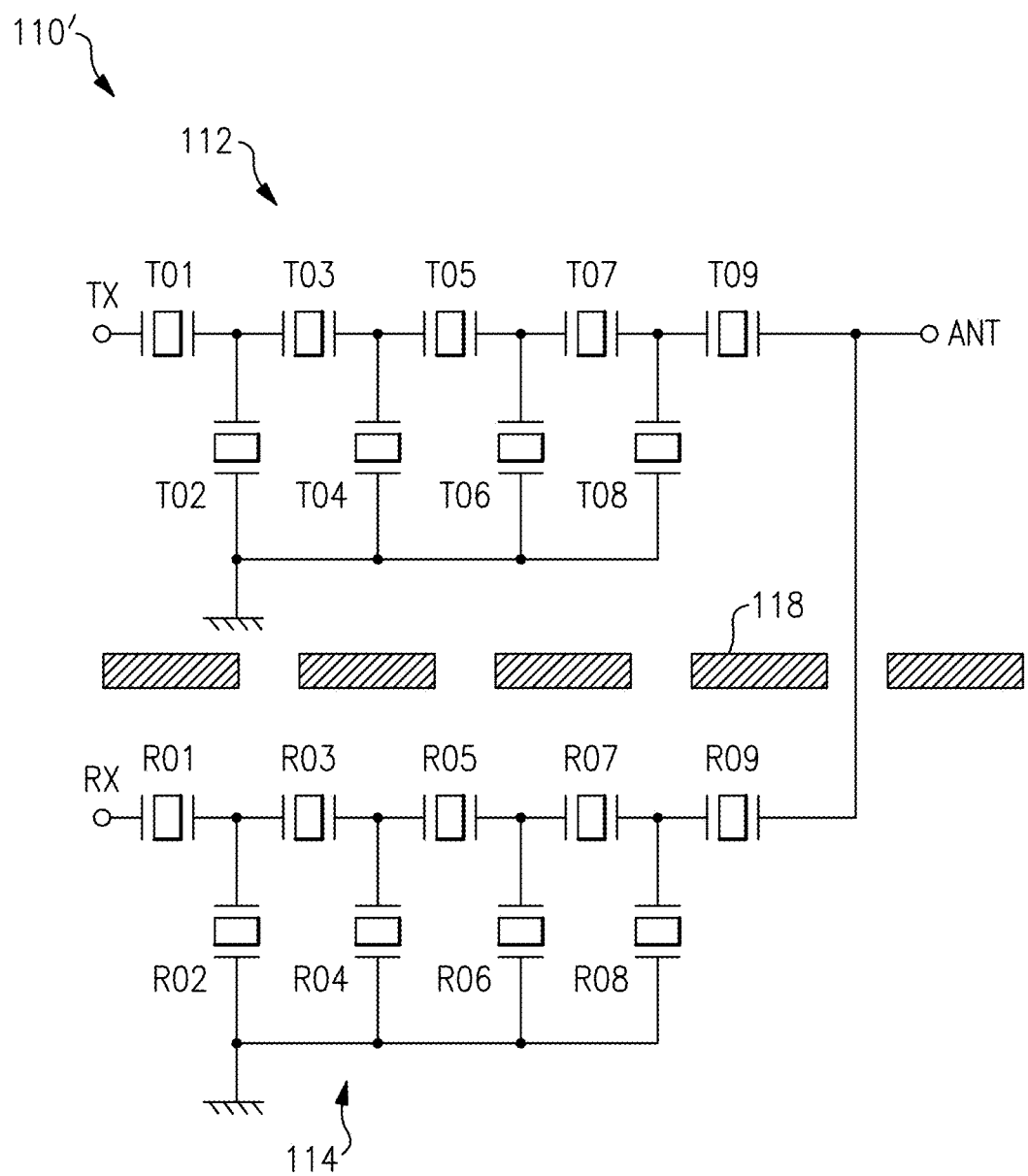
FIG. 11B is a schematic diagram of a duplexer with an isolation region between acoustic wave filters according to another embodiment.

FIG. 11B is a schematic diagram of a duplexer 110' with an isolation region 118 in a substrate located between acoustic wave filters according to another embodiment. The duplexer 110' is like the duplexer 110 of FIG. 11A, except that the isolation region 118 of the duplexer 110' has a different shape than the isolation region 115 of the duplexer 110. The isolation region 118 has a shaped of a dashed line. A trace of the receive filter 114 can connect to a common node of the duplexer 110' through and/or over an opening in the isolation region 118. Accordingly, the trace of the receive filter 114 can extend through portions of the isolation region 118. The isolation region 118 also illustrates that an isolation region can include a plurality of discontinuous portions. The isolation region 118 can significantly reduce coupling through a substrate between the transmit filter 112 and the receive filter 114.

Figure 12A:
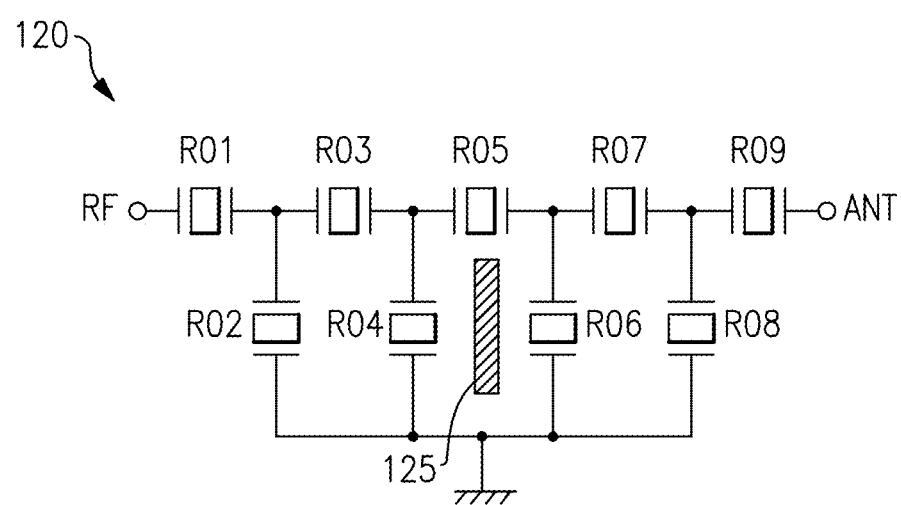
FIG. 12A is a schematic diagram of an acoustic wave filter with an isolation region between acoustic wave resonators according to an embodiment.

FIG. 12A is a schematic diagram of an acoustic wave filter 120 with an isolation region between acoustic wave resonators according to an embodiment. FIG. 12A illustrates that an isolation region in a substrate can be included between acoustic wave resonators of the same filter. The illustrated acoustic wave filter 120 includes acoustic wave resonators R01, R02, R03, R04, R05, R06, R07, R08, R09 arranged as a ladder filter between a radio frequency port RF (e.g., a transmit port or a receive port) and an antenna port ANT. As illustrated in FIG. 12A, an isolation region 125 is positioned between the shunt acoustic wave resonators R04 and R06. The isolation region 125 can reduce undesirable coupling between acoustic wave resonators R04 and R06 included within the same acoustic wave filter 120. For example, the isolation region 125 can reduce parasitic capacitance that bypasses the series acoustic wave resonator R05. Although one isolation region is shown in FIG. 12A, two or more isolation regions can be included between acoustic wave resonators of a single filter. An isolation region can be included between any two acoustic wave resonators of the acoustic wave filter 120 that are adjacent to each other in physical layout.

Figure 12B:
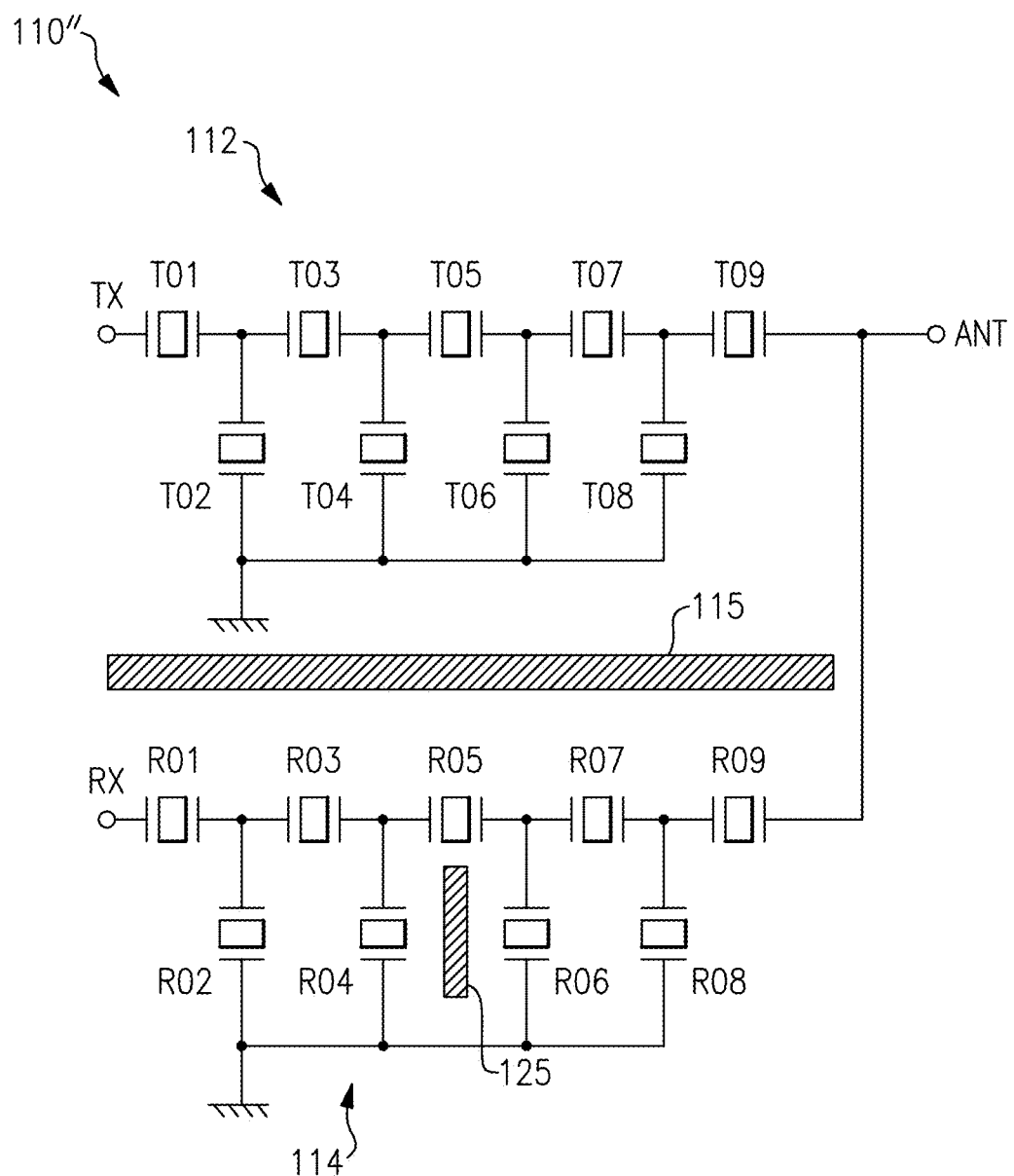
FIG. 12B is a schematic diagram of a duplexer with an isolation region between acoustic wave filters in which an acoustic wave filter has an isolation region between acoustic wave resonators according to an embodiment.

In some instances, an acoustic wave filter assembly can include an isolation region in a substrate between acoustic wave resonators of the same filter and a second isolation region in the substrate between acoustic wave resonators of different filters. FIG. 12B is a schematic diagram of a duplexer 110" with a first isolation region 115 in a substrate located between acoustic wave filters 112 and 114, in which one of the acoustic wave filters 114 has a second isolation region 125 in the substrate located between acoustic wave resonators according to an embodiment. The duplexer 110" is like the duplexer 110 of FIG. 11A, except that the duplexer 110" also includes the isolation region 125. An acoustic wave filter component can include one or more isolation regions in a substrate between located between acoustic wave filters and one or more isolation regions in the substrate located between acoustic wave resonators of the same acoustic wave filter.

The acoustic wave filters and/or acoustic wave resonators with improved isolation disclosed herein can be implemented in a variety of packaged modules. Some example packaged modules will now be discussed in which any suitable principles and advantages of the acoustic wave filters and/or acoustic wave devices disclosed herein can be implemented. The example packaged modules can include a package that encloses the illustrated circuit elements. The illustrated circuit elements can be disposed on a common packaging substrate. The packaging substrate can be a laminate substrate, for example. FIGS. 13 to 16 are schematic block diagrams of illustrative packaged modules according to certain embodiments. Any suitable combination of features of these packaged modules can be implemented together with each other. While duplexers are illustrated in the example packaged modules of FIGS. 14 to 16, any other suitable multiplexer that includes a plurality of acoustic wave filters coupled to a common node can be implemented instead of one or more of the duplexers. For example, a quadplexer, a hexaplexer, an octoplexer, or the like can be implemented in certain applications. Alternatively or additionally, one or more filters of a packaged module can be arranged as a transmit filter or a receive filter that is not included in a multiplexer.

Figure 13:
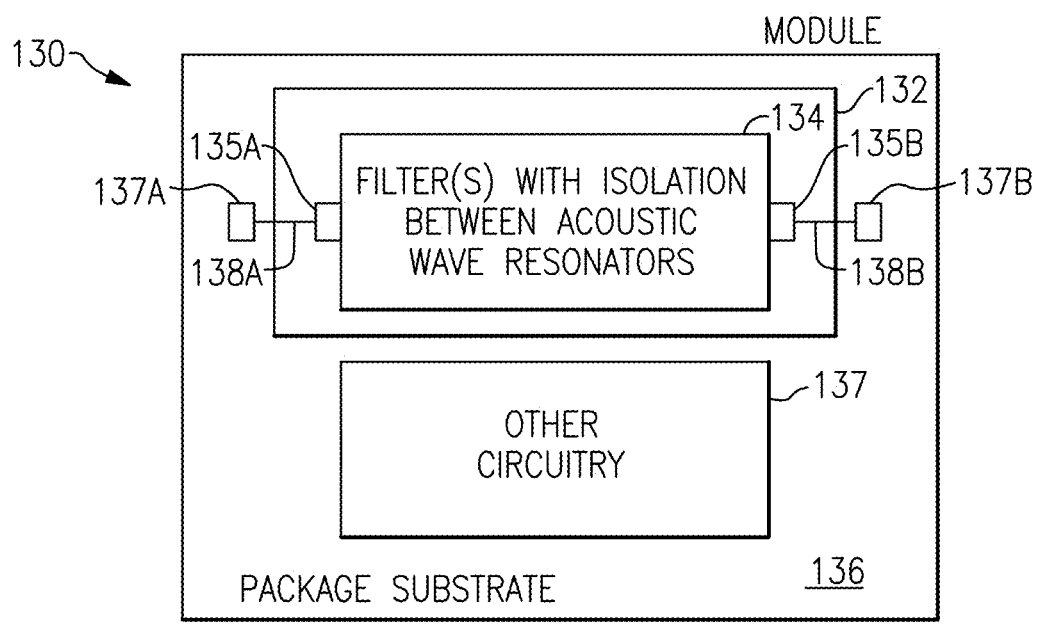
FIG. 13 is a schematic diagram of a radio frequency module that includes an acoustic wave filters with isolation according to an embodiment.

FIG. 13 is a schematic diagram of a radio frequency module 130 that includes an acoustic wave component 132 according to an embodiment. The illustrated radio frequency module 130 includes the acoustic wave component 132 and other circuitry 133. The acoustic wave component 132 can include acoustic wave resonators and/or acoustic wave filters in accordance with any suitable combination of features disclosed herein. The acoustic wave component 132 can include a SAW die that includes SAW resonators. The SAW die can include SAW resonators of two or more filters.

The acoustic wave component 132 shown in FIG. 13 includes filter(s) 134 and terminals 135A and 135B. The filter(s) 134 includes acoustic wave resonators with isolation between resonators and/or filters implemented in accordance with any suitable principles and advantages disclosed herein. The terminals 135A and 134B can serve, for example, as an input contact and an output contact. The acoustic wave component 132 and the other circuitry 133 are on a common packaging substrate 136 in FIG. 13. The package substrate 136 can be a laminate substrate. The terminals 135A and 135B can be electrically connected to contacts 137A and 137B, respectively, on the packaging substrate 136 by way of electrical connectors 138A and 138B, respectively. The electrical connectors 138A and 138B can be bumps or wire bonds, for example.

The other circuitry 133 can include any suitable additional circuitry. For example, the other circuitry can include one or more radio frequency amplifiers, one or more power amplifiers, one or more radio frequency switches, one or more additional filters, one or more low noise amplifiers, one or more radio frequency (RF) couplers, one or more delay lines, one or more phase shifters, one or more impedance matching circuits, the like, or any suitable combination thereof. The other circuitry 133 can be electrically connected to the filter(s) 134. The radio frequency module 130 can include one or more packaging structures to, for example, provide protection and/or facilitate easier handling of the radio frequency module 130. Such a packaging structure can include an overmold structure formed over the packaging substrate 130. The overmold structure can encapsulate some or all of the components of the radio frequency module 130.

Figure 14:
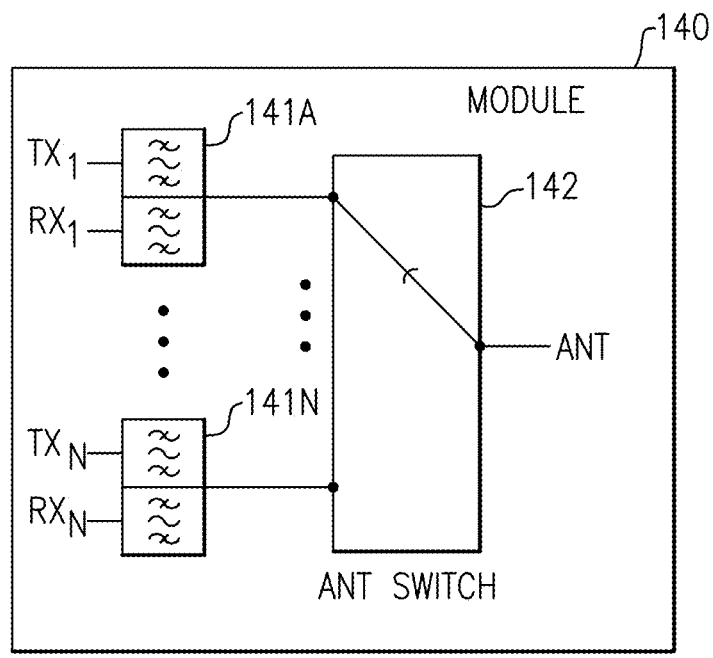
FIG. 14 is a schematic block diagram of a module that includes duplexers and an antenna switch according to an embodiment.

FIG. 14 is a schematic block diagram of a module 140 that includes duplexers 141A to 141N and an antenna switch 142. One or more of the duplexers 141A to 141N can an isolation region in a substrate and between acoustic wave resonators in accordance with any suitable principles and advantages discussed herein. Any suitable number of duplexers 141A to 141N can be implemented. The antenna switch 142 can have a number of throws corresponding to the number of duplexers 141A to 141N. The antenna switch 142 can include one or more additional throws coupled to one or more filters external to the module 140 and/or coupled to other circuitry. The antenna switch 142 can electrically couple a selected duplexer to an antenna port of the module 140.

Figure 15A:
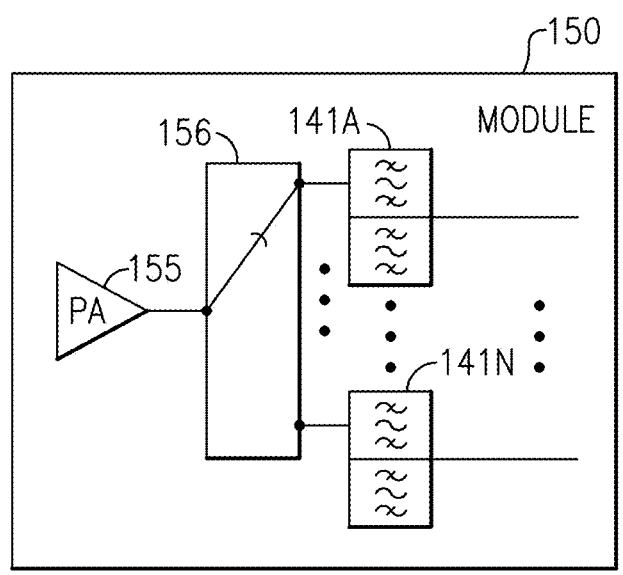
FIG. 15A is a schematic block diagram of a module that includes a power amplifier, a radio frequency switch, and duplexers according to an embodiment.

FIG. 15A is a schematic block diagram of a module 150 that includes a power amplifier 155, a radio frequency switch 156, and duplexers 141A to 141N in accordance with one or more embodiments. The power amplifier 155 can amplify a radio frequency signal. The radio frequency switch 156 can be a multi-throw radio frequency switch. The radio frequency switch 156 can electrically couple an output of the power amplifier 155 to a selected transmit filter of the duplexers 141A to 141N. One or more of the duplexers 141A to 141N can include an isolation region in a substrate and between acoustic wave resonators in accordance with any suitable principles and advantages discussed herein. Any suitable number of duplexers 141A to 141N can be implemented.

Figure 15B:
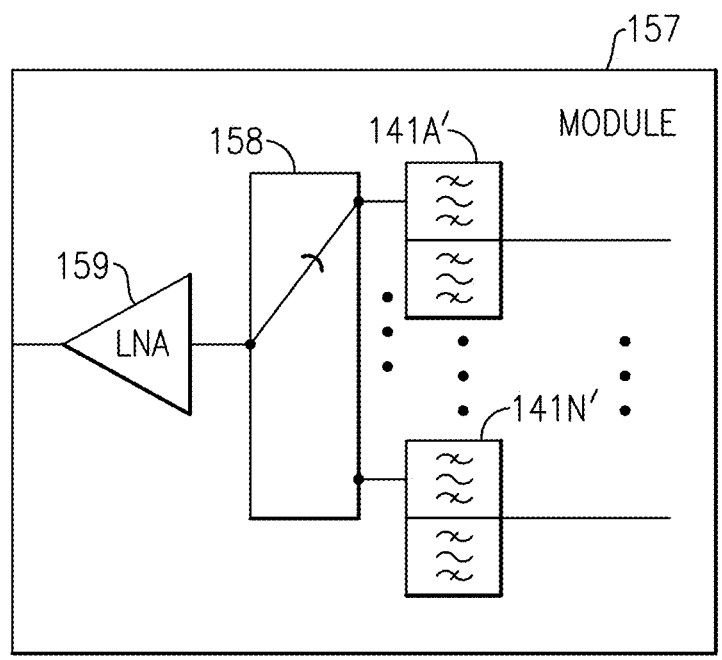
FIG. 15B is a schematic block diagram of a module that includes duplexers, a radio frequency switch, and a low noise amplifier according to an embodiment.

FIG. 15B is a schematic block diagram of a module 157 that includes duplexers 141A' to 141N', a radio frequency switch 158, and a low noise amplifier 159 according to an embodiment. One or more filters of the duplexers 141A' to 141N' can include an isolation region in a substrate and between acoustic wave resonators in accordance with any suitable principles and advantages disclosed herein. Any suitable number of duplexers 141A' to 141N' can be implemented. The illustrated duplexers 141A' to 141N' include receive filters coupled to the radio frequency switch 158. One or more of the illustrated duplexers 141A' to 141N' can also include a transmit filter. The radio frequency switch 158 can be a multi-throw radio frequency switch. The radio frequency switch 158 can electrically couple an output of a selected filter of duplexers 141A' to 141N' to the low noise amplifier 159. The radio frequency switch 158 can electrically couple an output of a plurality of selected filters of duplexers 141A' to 141N' to the low noise amplifier 159. In some embodiments (not illustrated), a plurality of low noise amplifiers can be implemented. The module 157 can include diversity receive features in certain applications.

Figure 16:
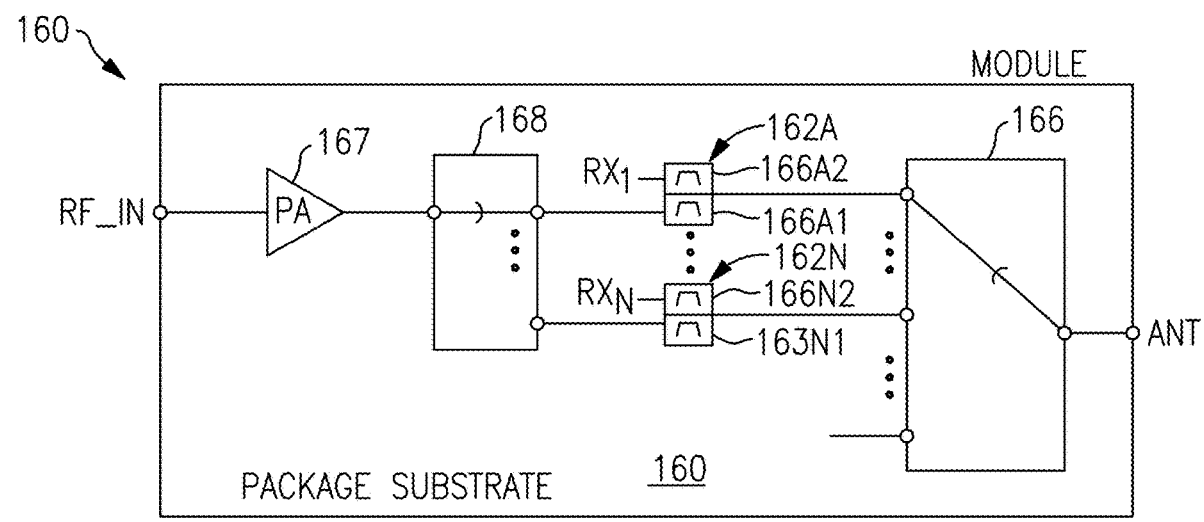
FIG. 16 is a schematic diagram of a radio frequency module that includes an acoustic wave filters according to an embodiment.

FIG. 16 is a schematic diagram of a radio frequency module 160 that includes an acoustic wave filter according to an embodiment. As illustrated, the radio frequency module 160 includes duplexers 162A to 162N that include respective transmit filters 163A1 to 163N1 and respective receive filters 163A2 to 163N2, a power amplifier 164, a select switch 165, and an antenna switch 166. The radio frequency module 160 can include a package that encloses the illustrated elements. The illustrated elements can be disposed on a common packaging substrate 167. The packaging substrate 167 can be a laminate substrate, for example. A radio frequency module that includes a power amplifier can be referred to as a power amplifier module. The illustrated radio frequency module 160 can be referred to as a power amplifier module including duplexers. A radio frequency module can include a subset of the elements illustrated in FIG. 16 and/or additional elements. The radio frequency module 160 may include one or more isolation regions in a substrate and between acoustic wave resonators in accordance with any suitable principles and advantages disclosed herein.

The duplexers 162A to 162N can each include two acoustic wave filters coupled to a common node. For example, the two acoustic wave filters can be a transmit filter and a receive filter. As illustrated, the transmit filter and the receive filter can each be a band pass filter arranged to filter a radio frequency signal. One or more of the transmit filters 163A1 to 163N1 can have reduced capacitive coupling with one or more respective receive filters 163A2 to 163N2 in accordance with any suitable principles and advantages disclosed herein. Although FIG. 16 illustrates duplexers, any suitable principles and advantages disclosed herein can be implemented in other multiplexers (e.g., quadplexers, hexaplexers, octoplexers, etc.) and/or in switch-plexers.

The power amplifier 164 can amplify a radio frequency signal. The illustrated switch 165 is a multi-throw radio frequency switch. The switch 165 can electrically couple an output of the power amplifier 164 to a selected transmit filter of the transmit filters 163A1 to 163N1. In some instances, the switch 165 can electrically connect the output of the power amplifier 164 to more than one of the transmit filters 163A1 to 163N1. The antenna switch 166 can selectively couple a signal from one or more of the duplexers 162A to 162N to an antenna port ANT. The duplexers 162A to 162N can be associated with different frequency bands and/or different modes of operation (e.g., different power modes, different signaling modes, etc.).

The acoustic wave resonator assemblies and/or acoustic wave filter assemblies disclosed herein can be implemented in a variety of wireless communication devices. FIG. 17A is a schematic diagram of a wireless communication 170 device that includes filters 173 in a radio frequency front end 172 according to an embodiment. The wireless communication device 170 can be any suitable wireless communication device. For instance, a wireless communication device 170 can be a mobile phone, such as a smart phone. As illustrated, the wireless communication device 170 includes an antenna 171, an RF front end 172, a transceiver 174, a processor 175, a memory 176, and a user interface 177. The antenna 171 can transmit RF signals provided by the RF front end 172. Such RF signals can include carrier aggregation signals. The antenna 171 can receive RF signals and provide the received RF signals to the RF front end 172 for processing. The wireless communication device 170 can include two or more antennas in certain instances.

The RF front end 172 can include one or more power amplifiers, one or more low noise amplifiers, one or more RF switches, one or more receive filters, one or more transmit filters, one or more duplexer, one or more multiplexers, one or more frequency multiplexing circuits, the like, or any suitable combination thereof. The RF front end 172 can transmit and receive RF signals associated with any suitable communication standards. The filters 173 can be implemented with one or more isolation regions and include any suitable combination of features of the embodiments disclosed herein.

The transceiver 174 can provide RF signals to the RF front end 172 for amplification and/or other processing. The transceiver 174 can also process an RF signal provided by a low noise amplifier of the RF front end 172. The transceiver 174 is in communication with the processor 175. The processor 175 can be a baseband processor. The processor 175 can provide any suitable base band processing functions for the wireless communication device 170. The memory 176 can be accessed by the processor 175. The memory 176 can store any suitable data for the wireless communication device 170. The user interface 177 can be any suitable user interface, such as a display with touch screen capabilities.

FIG. 17B is a schematic diagram of a wireless communication device 180 that includes filters 173 in a radio frequency front end 172 and second filters 183 in a diversity receive module 182. The wireless communication device 180 is like the wireless communication device 170 of FIG. 17A, except that the wireless communication device 180 also includes diversity receive features. As illustrated in FIG. 17B, the wireless communication device 180 includes a diversity antenna 181, a diversity module 182 configured to process signals received by the diversity antenna 181 and including filters 183, and a transceiver 184 in communication with both the radio frequency front end 172 and the diversity receive module 182. The radio frequency front end 172 and the diversity receive module 182 can both be considered part of a radio frequency front end. One or more of the second filters 183 can be implemented in accordance with any suitable principles and advantages disclosed herein.

An acoustic wave filter of any of the embodiments disclosed herein can be arranged to filter a radio frequency signal in a fifth generation (5G) New Radio (NR) operating band within Frequency Range 1 (FR 1). A multiplexer, such as a duplexer, in accordance with any suitable principles and advantages disclosed herein can include a filter arranged to filter a radio frequency signal in a 5G NR operating band with FR 1. FR 1 can be from 410 megahertz (MHz) to 7.125 gigahertz (GHz), for example, as specified in a current 5G NR specification. An acoustic wave filter of any of the embodiments disclosed herein can be arranged to filter a radio frequency signal in a fourth generation (4G) Long Term Evolution (LTE) operating band. An acoustic wave filter of any of the embodiments disclosed herein can have a passband a passband that includes a 4G LTE operating band and a 5G NR operating band.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes example embodiments, the teachings described herein can be applied to a variety of structures. Any of the principles and advantages discussed herein can be implemented in association with RF circuits configured to process signals having a frequency in a range from about 30 kilohertz (kHz) to 300 GHz, such as in a frequency range from about 450 MHz to 8.5 GHz. Acoustic wave filters disclosed herein can filter RF signals at frequencies up to and including millimeter wave frequencies.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a robot such as an industrial robot, a stereo system, a digital music player, a radio, a camera such as a digital camera, a portable memory chip, a home appliance such as a washer or a dryer, a peripheral device, a wrist watch, a clock, etc. Further, the electronic devices can include unfinished products.

Unless the context indicates otherwise, throughout the description and the claims, the words "comprise," "comprising," "include," "including" and the like are to generally be construed in an inclusive sense, as opposed to an exclusive or exhaustive sense; that is to say, in the sense of "including, but not limited to." Conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively.

While certain embodiments have been described, these embodiments have been presented by way of example only, and are not intended to limit the scope of the disclosure. Indeed, the novel resonators, devices, modules, apparatus, methods, and systems described herein may be embodied in a variety of other forms. Furthermore, various omissions, substitutions and changes in the form of the resonators, devices, modules, apparatus, methods, and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and/or acts of the various embodiments described above can be combined to provide further embodiments. The accompanying claims and their equivalents are intended to cover such forms or modifications as would fall within the scope and spirit of the disclosure.

What is claimed is:

1. A method of manufacturing an acoustic wave component that includes acoustic wave resonators, the method comprising:

providing a first acoustic wave resonator and a second acoustic resonator, the first acoustic wave resonator and the second acoustic wave resonator sharing a substrate; and applying, with a laser, laser light to alter a region of the substrate located between the first acoustic wave resonator and the second acoustic wave resonator, the region of the substrate to which the laser light is applied being solid after the applying and the substrate being monolithic after the applying.

2. The method of claim 1 wherein the first acoustic wave resonator is a first surface acoustic wave resonator, and the second acoustic wave resonator is a second surface acoustic wave resonator.

3. The method of claim 2 wherein the substrate is a lithium niobate substrate.

4. The method of claim 2 wherein the substrate is a lithium tantalate substrate.

5. The method of claim 1 wherein the first acoustic wave resonator is included in a first filter, and the second acoustic wave resonator is included in the second filter.

6. The method of claim 5 wherein the first filter and the second filter are coupled to each other at a common node, and the first filter and the second filter are included in a multiplexer.

7. The method of claim 1 further comprising aligning the laser to a feature on the substrate before the applying.

8. The method of claim 1 further comprising performing wafer level packaging after the applying.

9. The method of claim 1 wherein the region extends only part way through a thickness of the substrate.

10. The method of claim 1 wherein the region has a lower dielectric constant than other regions of the substrate.

11. The method of claim 1 wherein the substrate has a crystalline structure that is disrupted in the region.

12. The method of claim 1 wherein the region of the substrate is amorphous after the applying.

13. The method of claim 1 wherein the region of the substrate is polycrystalline after the applying.

14. The method of claim 1 wherein the substrate is a piezoelectric substrate having a crystalline structure, and the applying causes the crystalline structure in the region to undergo a phase change to a state with a lower dielectric constant than before the applying.

15. A method of manufacturing an acoustic wave component, the method comprising:

forming a first acoustic wave resonator and a second acoustic resonator that share a substrate;

aligning a laser to a feature on the substrate;

applying, with the laser, laser light to alter a region of the substrate located between the first acoustic wave resonator and the second acoustic wave resonator, the region of the substrate to which the laser light is applied being amorphous or polycrystalline after the applying; and after the applying, packaging the first acoustic wave resonator and the second acoustic wave resonator to form a packaged acoustic wave component.

16. The method of claim 15 wherein the first acoustic wave resonator is a first surface acoustic wave resonator, and the second acoustic wave resonator is a second acoustic wave resonator.

17. The method of claim 15 wherein the substrate is a lithium based piezoelectric substrate.

18. The method of claim 15 wherein the region extends through some but not all of a thickness of the substrate.

19. The method of claim 15 wherein the first acoustic wave resonator is included in a first filter, a second acoustic wave resonator is included in a second filter, and the region is located between the first filter and the second filter.

20. A method of manufacturing a surface acoustic wave component, the method comprising:

providing a piezoelectric substrate with a first interdigital transducer electrode of a first surface acoustic wave resonator and a second interdigital transducer electrode of a second surface acoustic resonator thereon;

aligning a laser to a feature on the piezoelectric substrate; and applying, with the laser, laser light to alter a region of the piezoelectric substrate located between the first interdigital transducer electrode and the second interdigital transducer electrode to cause a phase change in the region of the piezoelectric substrate and thereby reduce a dielectric constant of the region, the region to which the laser light is applied being solid after the applying and the piezoelectric substrate being monolithic after the applying.

21. The method of claim 20 wherein the feature is at least part of the first interdigital transducer electrode.

22. The method of claim 20 wherein the providing includes providing the piezoelectric substrate attached to a support substrate.

23. The method of claim 20 wherein the first surface acoustic wave resonator is included in a transmit filter of a multiplexer, the second surface acoustic wave resonator is included in a receive filter of the multiplexer, and the region is located between the transmit filter and the receive filter.

* * * * *